United States Patent
Nakamura et al.

(10) Patent No.: US 8,530,748 B2
(45) Date of Patent: Sep. 10, 2013

(54) SUBSTRATE WITH THROUGH-HOLES FOR GRID-LIKE AUXILIARY WIRING PATTERN

(75) Inventors: Nobuhiro Nakamura, Tokyo (JP); Yumiko Aoki, Tokyo (JP); Naoya Wada, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 156 days.

(21) Appl. No.: 13/080,269

(22) Filed: Apr. 5, 2011

(65) Prior Publication Data
US 2011/0180308 A1 Jul. 28, 2011

Related U.S. Application Data

(63) Continuation of application No. PCT/JP2009/067277, filed on Oct. 2, 2009.

(30) Foreign Application Priority Data

Oct. 6, 2008 (JP) ................ P.2008-259948

(51) Int. Cl.
*H05K 1/03* (2006.01)
(52) U.S. Cl.
USPC ........................................... 174/255
(58) Field of Classification Search
USPC ........................................... 174/255
See application file for complete search history.

(56) References Cited

U.S. PATENT DOCUMENTS

| | | | | | |
|---|---|---|---|---|---|
| 5,896,006 | A | * | 4/1999 | Kusaka et al. | 313/506 |
| 6,140,766 | A | * | 10/2000 | Okada et al. | 313/506 |
| 6,143,401 | A | * | 11/2000 | Fischer et al. | 428/322.7 |
| 6,157,127 | A | | 12/2000 | Hosokawa et al. | |
| 6,225,966 | B1 | * | 5/2001 | Ohtani et al. | 345/87 |
| 6,525,467 | B1 | * | 2/2003 | Eida et al. | 313/506 |
| 6,533,631 | B2 | * | 3/2003 | Asai et al. | 445/24 |
| 7,221,095 | B2 | * | 5/2007 | Yamazaki et al. | 313/509 |

(Continued)

FOREIGN PATENT DOCUMENTS

| | | |
|---|---|---|
| JP | 08-083688 A | 3/1996 |
| JP | 08-092551 A | 4/1996 |

(Continued)

*Primary Examiner* — Timothy Thompson
*Assistant Examiner* — Nathan Milakovich
(74) *Attorney, Agent, or Firm* — Foley & Lardner LLP

(57) ABSTRACT

A substrate includes an auxiliary wiring pattern formed on a first main surface of a glass substrate in a grid-like pattern arranged horizontally and vertically, and a translucent glass layer formed on a surface of the glass substrate to cover the first main surface and the auxiliary wiring pattern. Through-holes exposing the auxiliary wiring pattern are formed in a portion of the translucent glass layer formed on the auxiliary wiring pattern, in each side of each grid of the grid-like pattern at uniform intervals. The substrate may be used in an electronic device having a long-life and a high reliability in which exfoliation or deterioration of a wiring is inhibited by embedding the wiring therein while maintaining smoothness of the surface.

6 Claims, 27 Drawing Sheets

(56) References Cited

U.S. PATENT DOCUMENTS

| | | | |
|---|---|---|---|
| 7,375,461 B2 * | 5/2008 | Birnstock et al. | 313/504 |
| 7,408,191 B2 * | 8/2008 | Murakami et al. | 257/59 |
| 7,417,371 B2 * | 8/2008 | Birnstock et al. | 313/506 |
| 7,500,211 B2 * | 3/2009 | Komaki | 716/120 |
| 7,733,441 B2 * | 6/2010 | Seo et al. | 349/71 |
| 7,745,733 B2 * | 6/2010 | Jambor et al. | 174/254 |
| 8,179,036 B2 * | 5/2012 | Eser et al. | 313/504 |
| 8,439,718 B2 * | 5/2013 | Kim | 445/24 |
| 2005/0087769 A1 | 4/2005 | Yamazaki et al. | |
| 2008/0105877 A1 | 5/2008 | Yamazaki et al. | |
| 2009/0256470 A1 * | 10/2009 | Naono | 313/504 |
| 2011/0042696 A1 * | 2/2011 | Smith et al. | 257/89 |

FOREIGN PATENT DOCUMENTS

| | | |
|---|---|---|
| JP | 2931211 | 5/1999 |
| JP | 2005-149907 A | 6/2005 |
| JP | 2005-150105 A | 6/2005 |
| JP | 2005-308832 A | 11/2005 |
| JP | 2007-250435 A | 9/2007 |
| WO | WO 97/34447 A1 | 9/1997 |
| WO | WO 2008/035556 A1 | 3/2008 |

* cited by examiner

SUBSTRATE WITH THROUGH-HOLES FOR GRID-LIKE AUXILIARY WIRING PATTERN

TECHNICAL FIELD

The present invention relates to a substrate for an electronic device, a process for producing the same, and particularly relates to a substrate for an electronic device such as an organic LED (Organic Light Emitting Diode).

BACKGROUND ART

An organic LED element is one in which an organic layer is put between electrodes, and a voltage is applied between the electrodes to inject holes and electrons, which are be recombined in the organic layer, thereby extracting light that a light-emitting molecule emits in the course of transition from an excited state to a ground state.

Generally, light generated in the organic layer is transmitted to an electrode and reaches an interface between the electrode and a glass substrate. However, since the difference in the refractive index is large between the electrode and the glass substrate, a phenomenon occurs in which the light passing through the electrode is reflected at the glass substrate, and then returns to the electrode and the organic layer again. Accordingly, the amount of the light which can be extracted to the outside of the organic LED element is less than 20% of the emitted light in the present circumstances.

Accordingly, there is a document which proposes that a light scattering layer is provided on one surface of a substrate to improve the light-extraction efficiency (Patent Document 1).

Also, there is a document which proposes that an electrode is provided between a glass substrate and a glass layer (Patent Document 2).

BACKGROUND ART DOCUMENT

Patent Documents

Patent Document 1: Japanese Patent No. 2931211
Patent Document 2: JP-A-08-92551

SUMMARY OF THE INVENTION

Problems that the Invention is to Solve

However, none of the documents makes a disclosure or suggestion regarding the point of an increase in the area.

An object of the invention is to provide a substrate having a high light-extraction efficiency and compatible with the increase in the area.

Means for Solving the Problems

Accordingly, the present invention relates to a substrate for an electronic device in which an electrode wiring is formed on a first main surface side of a glass substrate including the first and a second main surfaces facing each other, the substrate comprising: an auxiliary wiring pattern formed on the first main surface of the glass substrate; and a translucent glass layer formed on a surface of the glass substrate to cover the first main surface as well as the auxiliary wiring pattern, wherein, in a portion of the glass layer on the auxiliary wiring pattern, through-holes exposing the auxiliary wiring pattern are formed.

With this constitution, since the entire auxiliary wiring pattern is confined to the glass layer except a connection area exposed through through-holes, there is no concern over deterioration of the auxiliary wiring pattern, and it is possible to provide an auxiliary wiring pattern which is stable and has a long-life. Also, the glass layer obtained by coating and firing glass materials formed of an oxide, a chalcogen material, a halide or a mixture thereof has a smooth surface, and it is possible to make the film thickness of a functional layer, including an electrode wiring formed on this upper layer, stable and uniform. The glass herein refers to an amorphous inorganic material obtained by cooling a resultant produced by fusing or softening a glass raw material through heating.

The invention also includes the substrate for the electronic device wherein a conductive member is filled in the through-hole, and the surface of the glass layer and the surface of the conductive member constitute substantially the same plane.

With this constitution, since additionally the surface including the through-hole area can be made smooth, it is possible to achieve further uniformity of the functional layer to be formed on the upper layer.

The invention also includes the substrate for the electronic device wherein the glass layer is a glass layer including a glass containing a base material having a first refractive index for at least one wavelength of light to be transmitted and scattering material dispersed in the base material and having a second refractive index different from that of the base material, the substrate including a translucent electrode formed on the scattering glass layer and having a third refractive index equal to or lower than the first refractive index.

Furthermore, in addition to the above constitution, it is preferable that the distribution of the scattering material in the glass layer decreases from the inside of the scattering glass layer toward the translucent electrode.

With this constitution, it is possible to improve the light-extraction efficiency.

The invention also includes the substrate for the electronic device wherein a density $\rho_2$ of the scattering material at a distance x (x≦0.2 μm) from the surface of the translucent electrode side of the scattering glass layer satisfies $\rho_1 > \rho_2$ with respect to the density $\rho_1$ of the scattering material in the central portion of the glass layer.

With this constitution, since the surface is smooth while having a scattering property, it is possible to improve the reliability of the element to be formed on the substrate.

The invention also includes the substrate for the electronic device wherein a surface roughness Ra of the surface of the glass layer is 30 nm or less.

The invention also includes the substrate for the electronic device wherein the content of the scattering material in the glass layer is at least 1 vol %.

The invention also includes the substrate for the electronic device wherein the scattering material is pores.

The invention also includes the substrate for the electronic device wherein the scattering material is material particles having a composition different from that of the base layer.

The invention also includes the substrate for the electronic device wherein the scattering material is precipitated crystals of a glass constituting the base layer.

The invention also includes the substrate for the electronic device wherein the number of pieces of the scattering material per 1 $mm^2$ of the glass layer is at least $1 \times 10^4$.

The invention also includes the substrate for the electronic device wherein, in the scattering material, the proportion of the scattering material having a maximum length of 5 μm or longer is 15 vol % or less.

The invention also includes the substrate for the electronic device wherein the glass layer is selectively formed on the glass substrate to constitute a desired pattern.

The invention also includes the substrate for the electronic device wherein the first refractive index for at least one wavelength among wavelengths λ (430 nm<λ<650 nm) is 1.8 or more.

The invention also includes the substrate for the electronic device wherein the glass layer has an average thermal expansion coefficient over the range of 100° C. to 400° C. of $70 \times 10^{-7}$ (° C.$^{-1}$) to $95 \times 10^{-7}$ (° C.$^{-1}$), and a glass transition temperature of 450° C. to 550° C.

The invention also includes the substrate for the electronic device wherein the glass layer contains 20 to 30 mol % of $P_2O_5$, 3 to 14 mol % of $B_2O_3$, 10 to 20 mol % of the total contents of $Li_2O$, $Na_2O$ and $K_2O$, 10 to 20 mol % of $Bi_2O_3$, 3 to 15 mol % of $TiO_2$, 10 to 20 mol % of $Nb_2O_5$ and 5 to 15 mol % of $WO_3$.

The invention also includes the substrate for the electronic device wherein the auxiliary wiring pattern is a thick film wiring pattern.

The invention also includes the substrate for the electronic device wherein the auxiliary wiring pattern is covered with a protective layer and the glass layer is formed on the upper layer of the protective layer.

The invention also includes the substrate for the electronic device wherein the auxiliary wiring pattern is a grid-like pattern arranged horizontally and vertically.

The invention also includes the substrate for the electronic device wherein the auxiliary wiring pattern is a comb-like pattern.

The invention also includes the substrate for the electronic device wherein the through-holes are constituted with a plurality of openings formed at uniform intervals with respect to the grid-like pattern.

The invention also includes the substrate for the electronic device wherein the auxiliary wiring pattern is a light-blocking pattern.

The invention also includes the substrate for the electronic device wherein the through-hole includes a tapered cross-section with an opening diameter enlarged as the tapered cross-section moves away from the auxiliary wiring pattern.

The invention also includes the substrate for the electronic device wherein a cross-section of the through-hole is perpendicular to the first main surface.

The invention also includes forming an auxiliary wiring pattern on a first main surface of a glass substrate and forming a glass layer on the surface of the glass substrate to cover the first main surface including the entire surface except for a portion of the auxiliary wiring pattern, wherein a substrate for an electronic device including a glass layer having through-holes through which a part of the auxiliary wiring pattern is exposed is produced by the invention.

The invention also includes forming an auxiliary wiring pattern on a first main surface of a glass substrate, forming a glass layer on the surface of the glass substrate to cover the first main surface including the auxiliary wiring pattern, and forming through-holes by removing a portion of the glass layer on the auxiliary wiring pattern to expose a portion of the auxiliary wiring pattern, wherein a substrate for an electronic device including the glass layer having the through-holes through which a portion of the auxiliary wiring pattern is exposed is produced by the invention.

The invention also includes a process for producing the substrate for the electronic device, the process including filling a conductive member in the through-hole so that the surface of the glass layer and the surface of the conductive member constitute substantially the same plane.

The invention also includes a process for producing the substrate for the electronic device, the process including polishing the surface after the above-mentioned filling step.

The invention also includes an electronic device having a substrate for an electronic device including a glass substrate; an auxiliary wiring pattern formed on a first main surface of the glass substrate; and a glass layer formed on the surface of the glass substrate to cover the first main surface as well as the auxiliary wiring pattern except for a portion constituting a through-hole and a functional element formed on the glass substrate, wherein the functional element is conductively connected to the auxiliary wiring pattern through the through-hole formed in a portion of the glass layer.

The invention also includes the electronic device, wherein the through-hole is filled with the conductive member, the auxiliary wiring pattern is conductively connected to the functional element, and the surface of the glass layer and the surface of the conductive member constitute substantially the same plane.

The invention also includes the electronic device, wherein the auxiliary wiring pattern is a grid-like pattern arranged horizontally and vertically.

The invention also includes the electronic device, wherein the auxiliary wiring pattern is a light-blocking pattern and constitutes a black matrix.

The invention also includes the electronic device, wherein the auxiliary wiring pattern is a comb-like pattern.

The invention also includes the substrate for the electronic device, wherein the through-holes are arranged at uniform intervals along the auxiliary wiring pattern.

The invention also includes the electronic device, wherein the glass layer is a glass layer including a glass containing a base material having a first refractive index for at least one wavelength of light to be transmitted and a plurality of pieces of scattering material dispersed in the base material and having a second refractive index different from that of the base material, the functional element formed on the glass layer includes a translucent electrode having a third refractive index equal to or lower than the first refractive index, and the translucent electrode is conductively connected to the conductive member in the through-hole.

Furthermore, in addition to the above constitution, it is preferable that the distribution of the scattering material in the glass layer decreases from the inside of the glass layer toward the translucent electrode.

The invention also includes the electronic device, wherein the functional element is an organic LED element including a layer formed of an organic layer on the translucent electrode and having a light emission function and a second electrode formed to face the translucent electrode, and the second electrode is formed to avoid the position on the through-hole. That is, the second electrode is formed into a pattern that does not exist on the through-hole.

With this constitution, since the second electrode is not formed on the surface that is not flat, as the light-emitting region is not formed, it is possible to prevent a short circuit between the translucent electrode and the second electrode resulting from field concentration.

The invention also includes the electronic device, wherein an external extraction terminal is formed on the through-hole.

The invention also includes the electronic device, wherein the auxiliary wiring pattern is formed to be stripes, the translucent electrode is connected to the auxiliary wiring pattern, and the device further includes a layer formed on the translucent electrode and having a light emitting function and a reflective electrode formed on the layer having the light emitting function and arranged in a direction orthogonal to the auxiliary wiring pattern.

The invention also includes the substrate for the electronic device, the substrate further including a light-blocking member formed in the upper layer or in the lower layer of the auxiliary wiring pattern and having a width wider than that of the auxiliary wiring pattern.

The invention also includes the substrate for the electronic device, wherein the light blocking member is a protective layer formed to cover the auxiliary wiring pattern.

The invention also includes forming an auxiliary wiring pattern on a first main surface of a glass substrate; forming a glass layer in which the through-holes are provided on the glass substrate surface to cover the first main surface including the entire auxiliary wiring pattern except for a portion of the auxiliary wiring pattern kept for forming the through-holes; and forming a functional element on the glass substrate so that the element is connected to the auxiliary wiring pattern through the through-hole formed in a portion of the glass layer.

The invention also includes a process for producing the electronic device, the process including filling the conductive member constituting substantially the same plane as the surface of the glass layer in the through-hole, wherein the forming step of the functional element includes forming an electrode of the functional element so that the electrode abuts on the conductive member.

Advantage of the Invention

According to the invention, it is possible to provide a substrate having a high light-extraction efficiency and deal with the increase in the area.

BRIEF DESCRIPTION OF DRAWINGS

FIG. 1 are views showing structures of a substrate for an electronic device and an organic LED element of an embodiment 1 of the invention.

FIG. 3 are views showing structures of a substrate for an electronic device and an organic LED element of an embodiment 2 of the invention.

FIG. 4 are views showing structures of a substrate for an electronic device and an organic LED element of an embodiment 3 of the invention.

FIG. 7 are views showing structures of a substrate for an electronic device and an organic LED element of an embodiment 4 of the invention.

FIG. 8 are illustrative views of cross sections of an example in which waviness is provided on the surface of the glass layer of the invention.

MODE FOR CARRYING OUT THE INVENTION

Embodiment 1

Figure 1A:
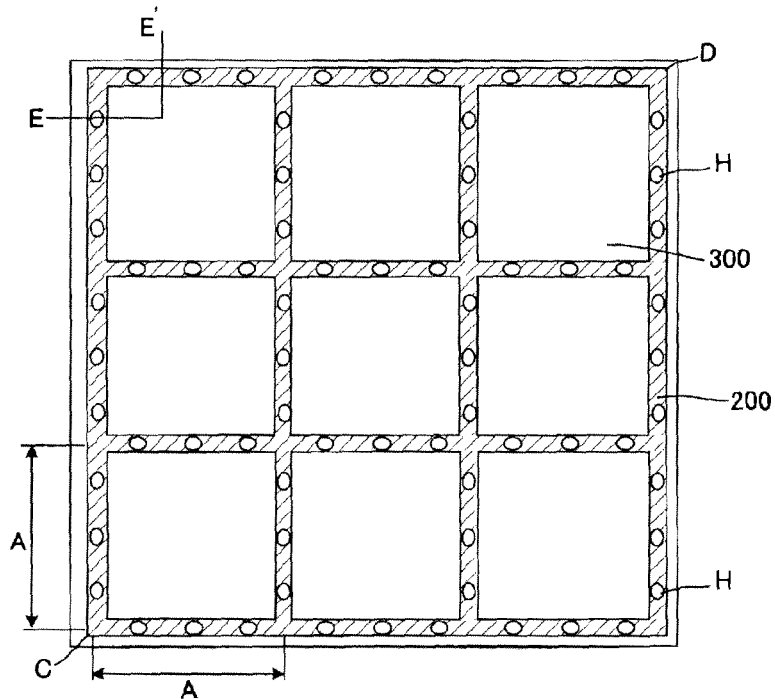
FIG. 1(a) is a plan view of the substrate for the electronic device.

A substrate for an electronic device of Embodiment 1 of the invention and an organic LED element using the same will be described below with reference to the drawings. FIG. 1(a) is a plan view showing the substrate for the electronic device of the embodiment of the invention, and FIG. 1(b) is a cross sectional view taken along the E-E' surface showing the organic LED element formed on the substrate for the electronic device.

Figure 1B:
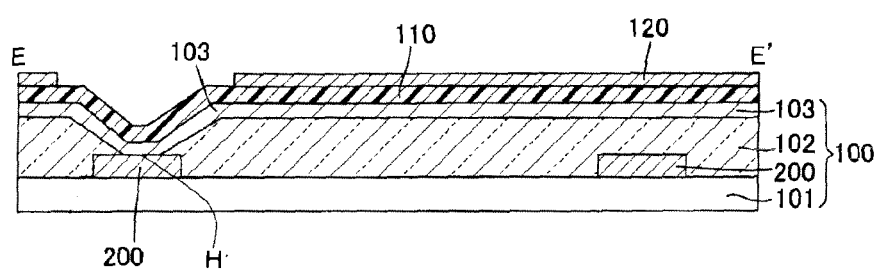
FIG. 1(b) is a cross sectional view of the organic LED element.

As shown in FIGS. 1(a) and 1(b), the substrate for the electronic device for forming the organic LED element of the invention includes a glass substrate 101, an auxiliary wiring pattern (conductive wiring) 200 formed to be a grid shape on a first main surface of the glass substrate 101, and a translucent glass layer 102 formed on the surface of the glass substrate to cover the first main surface as well as the auxiliary wiring pattern 200, and a through-hole H exposing the auxiliary wiring pattern 200 is formed in a portion of the glass layer 102.

The three through-holes H are provided in each side of a section with a length and width of A constituting one grid at uniform intervals. Each through-hole H is formed into a shape having a tapered cross section in the glass layer 102, and an ITO layer as a translucent electrode 103 is provided on the through-hole H through the entire surface in an integrated manner. Accordingly, currents are carried to the translucent electrode 103 from the auxiliary wiring pattern 200 through the through-hole, and the organic LED element is a bottom emission type of organic LED element constituting a light-emitting region 300 and extracting light to the glass substrate 101 side. The light-emitting region 300 is a laminated region where a layer 110 including an organic layer and having a light emitting function is formed on the translucent electrode 103, and a reflective electrode 120 is formed on the layer 110. However, since the entire light-emitting region 300 is arranged within a certain distance from the through-hole H, it is possible to reduce a voltage drop. C and D herein represent positions respectively.

Next, a process for producing the substrate for an electronic device and an electronic device using the same will be described. FIGS. 2(a) to 2(d) are cross sectional views sequentially showing steps of an example of a first production process of the invention, and are cross sections corresponding to FIG. 1(b).

Figure 2A:
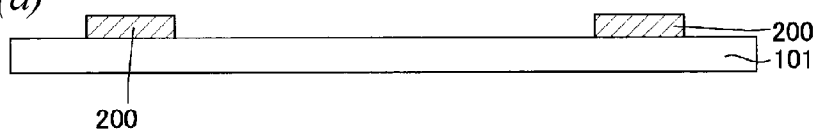
FIG. 2 are views of production steps of the organic LED element of the embodiment 1 of the invention.

First, the glass substrate 101 is prepared, and the surface thereof is polished if necessary. Thereafter, through screen printing performed by using a silver paste, for example, the auxiliary wiring pattern 200 having a paste film thickness of 10 μm, a line width of 200 μm, and a grid shape of 10 cm×10 cm and including silver as a main component is formed, as shown in FIG. 2(a).

The auxiliary wiring pattern may be set within a necessary range depending on the specific resistance, film thickness, and wiring width of the wiring material, the current value required for the functional element connected thereto, the size of the electronic device or the like. As a guide, it is preferable that the film thickness of the auxiliary wiring is 0.5 to 30 μm, the wiring width is 0.05 to 2 mm, and the interval of the auxiliary wiring is 2 to 50 cm. Also, in the production example of the embodiment, it is desirable to make the film thickness of the auxiliary wiring to be 0.5 to 20 μm since steps do not easily occur in this thickness. In order to reduce the specific resistance, it is desirable if the film thickness of the auxiliary wiring is large, and it is desirable that the film thickness is 0.5 μm or more. However, if the film thickness exceeds 30 μm, the coatability for the steps decreases, hence many problems occur in practical use.

In this example, the auxiliary wiring pattern is formed into a grid shape as shown in FIG. 1; however, various shapes can be used for the auxiliary wiring pattern such as a striped shape, a comb-like shape, a shape of branching in orthogonal directions from lines of stripes, a shape connected through broken lines just like the symbol of resistance, or a shape in which circular arcs are connected to each other.

Thereafter, by printing the glass paste through the screen printing on the substrate except for the portion in which the through-hole will be formed, the glass layer 102 having the through-hole H is formed.

Figure 2B:
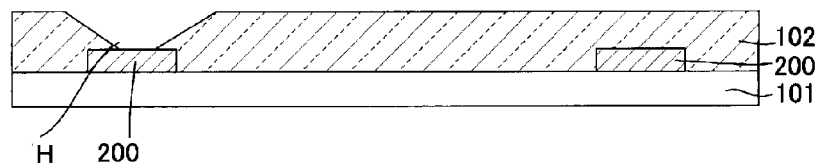

Subsequently, by performing firing, the substrate for the electronic device in which the auxiliary wiring pattern 200 is coated with the glass layer 102 with the through-holes is formed, as shown in FIG. 2(b). The glass layer 102 may not be formed in the end portion of the auxiliary wiring pattern 200 to be extracted outside.

The through-hole is formed into a tapered shape in which a cross section of a surface parallel to a through-hole axis (a vertical direction to the substrate surface) is inclined, in this example. However, the through-hole may have a cylindrical shape or a rectangular columnar shape in which the cross section becomes vertical. Here, when an electrode layer is formed on the through-hole directly as in this example, it is desirable that the through-hole is formed into the tapered shape since the disconnection of the conductive connection between the electrode formed on the through-hole and the auxiliary wiring does not easily occur.

The through-hole may be appropriately set so as not to have negative influence caused by voltage drop. However, when the auxiliary wiring has a grid shape, at least one through-hole is provided in each side of a grid, and it is desirable to provide two or more of the through-holes in each side. Here, if the number of the through-holes increases too much, unevenness on the surface increases; therefore, it is desirable to provide about two to five through-holes in each side. When the auxiliary wiring has a striped shape, about one to five through-holes may be provided at the same intervals as that of the stripes.

As the planar shape of the through-hole, shapes such as a circular shape, an oval shape, and a rectangular shape can be used. However, it is desirable to use the oval shape and the rectangular shape in which the opening is enlarged with respect to the longitudinal direction of the auxiliary wiring. Particularly, it is desirable to use the oval shape or the rectangular shape in which a long axis and a long side are 1.5 times or more longer than a short axis and a short side, since large current flows to the end of the through-hole substantially due to a fact that the surface resistance of the auxiliary wiring is smaller than that of the translucent electrode.

The glass layer 102 may be formed of a material forming a translucent glass layer by firing, and the detailed description will be made later. The thickness of the glass layer may be 1.1 to 10 times of the film thickness of the auxiliary wiring at a point of time when the glass layer is completed as a substrate, and the thickness may be about 2 to 200 μm.

Figure 2C:
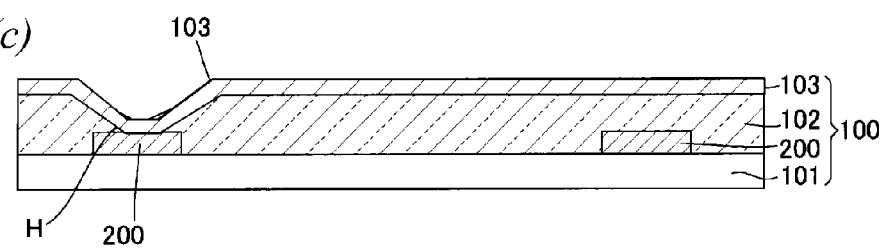

Subsequently, on the entire portion of the through-hole H and the glass layer 102, an ITO film as the translucent electrode 103 is formed, and as shown in FIG. 2(c), an electrode-attached substrate 100 for an electronic device is obtained.

Figure 2D:
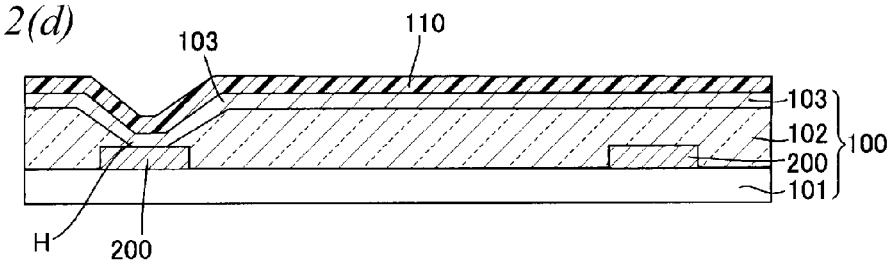

Then, as shown in FIG. 2(d), the layer 110 such as a hole-injection layer, a light-emitting layer, and an electron-injection layer with the light-emitting function is formed by, for example, a vapor deposition method.

In a case of the organic LED element, generally, layers with the light-emitting function, that is, the hole-injection layer, a light-emitting layer, and the electron-injection layer are used by being interposed between a first electrode and a second electrode. Herein, the layer constitutes the functional element. Needless to say, these layers with the light-emitting function are not limited to a dry process such as the vapor deposition method but can also be formed by being applied to a wet process such as a coating method. Naturally, the invention is not limited to the five layer structure or to the organic LED element. The invention may be applied to any structure and element as long as they are the functional element at least having electrodes on the substrate side.

For the hole-injection layer, the light-emitting layer, and the electron-injection layer, known materials and structures are used. The first electrode is the translucent electrode, but the second electrode may be the translucent electrode or the reflective electrode.

For the translucent electrode, tin oxide or other materials can be used in addition to the above described ITO. As the reflective electrode, various metallic electrodes can be used, but aluminum, an AgMg alloy and Ca or the like is considered as a typical material.

In this example, when the through-hole is formed into the tapered shape, it is desirable that the reflective electrode pattern is not formed on the through-hole to prevent the short circuit between the reflective electrode and the auxiliary wiring or the translucent electrode. Such a reflective electrode can be formed into the pattern in the above manner by using, for example, a mask.

In the above description, the auxiliary wiring pattern is formed by the screen printing of the silver paste. However, the auxiliary wiring pattern can also be formed by other printing methods, a dipping method, a plating method, a vapor deposition method, a sputtering method or the like, and the applicable materials thereof include metals such as Au, Ag, Cu, Al, Cr, Mo, Pt, W, Ni, and Ru, metal compounds, metal pastes and the like. These may be appropriately selected as necessary.

Here, in order to produce the auxiliary wiring having a large film thickness and a large area with a good productivity and low costs, the production performed by the above described screen printing is suitable. Using the metal pastes is advantageous in that the glass layer is formed by firing and the auxiliary wiring can be formed as well.

Embodiment 2

Figure 3A:
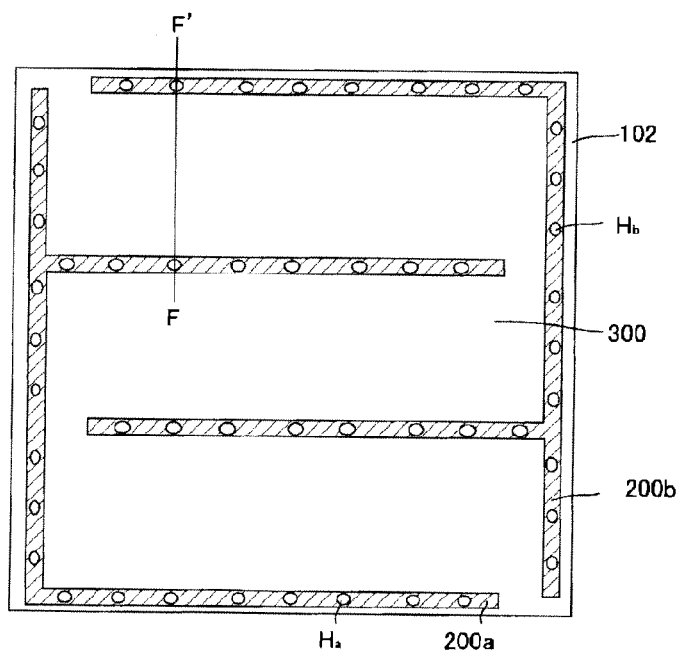
FIG. 3(a) is a plan view of the substrate for the electronic device.

Next, the substrate for the electronic device and the organic LED element using the same of Embodiment 2 of the invention will be described. FIG. 3(a) is a plan view of the substrate for the electronic device of the embodiment of the invention, and FIG. 3(b) is a cross sectional view of an F-F' surface showing the organic LED element formed on the substrate for the electronic device.

Figure 3B:
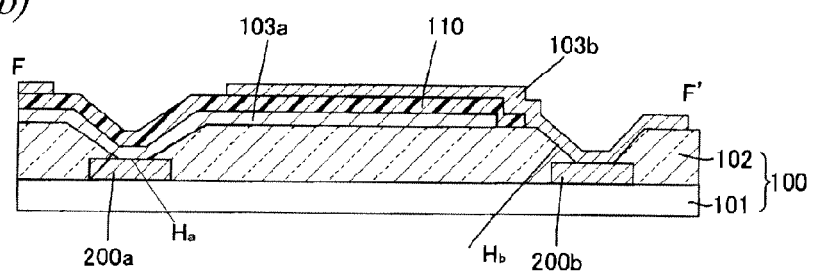
FIG. 3(b) is a cross sectional view of the organic LED element.

As shown in FIGS. 3(a) and 3(b), the substrate for the electronic device for forming the organic LED element of the invention includes a glass substrate 101, a first auxiliary wiring pattern 200a and a second auxiliary wiring pattern 200b which are formed into a comb-like shape on the first main surface of the glass substrate 101, and a translucent glass layer 102 formed on the surface of the glass substrate to cover the first main surface as well as the first and second auxiliary wiring patterns 200a and 200b, wherein in a portion of the glass layer 102, through-holes $H_a$ and $H_b$ exposing the first and second auxiliary wiring patterns 200a and 200b are formed.

The through-holes $H_a$ and $H_b$ are respectively provided in each side constituting the comb at uniform intervals. Each through-hole $H_a$ for connection to the first auxiliary wiring pattern 200a is formed into a shape having a tapered cross section, and the ITO layer as a first translucent electrode 103a is provided on the through-hole $H_a$ in an integrated manner while avoiding the position on the through-hole $H_b$ formed in the comb-like patterns facing each other. Accordingly, the current is carried to the first translucent electrode 103a from the auxiliary wiring pattern 200a through the through-hole $H_a$. Also, the through-hole $H_b$ for connection to a second auxiliary wiring pattern 103b is formed into a shape having a tapered cross section, and the ITO layer as the second auxiliary wiring pattern 103b is provided on the through-hole $H_b$ in an integrated manner while avoiding the position on the through-hole $H_a$ formed in the comb-like patterns facing each other. Accordingly, the current is carried to the second auxiliary wiring pattern 103b from the auxiliary wiring pattern 200b through the through-hole $H_b$.

The organic LED element is a both emission type of organic LED element constituting the light-emitting region 300 and extracting light to the glass substrate 101 side and to the upper side. The light-emitting region 300 is a region where the first and the second translucent electrodes 103a and 103b and the layer 110 formed between the electrodes and having the light-emitting function are laminated to each other. However, since the entire light-emitting region 300 is arranged within a certain distance from the through-holes $H_a$ and $H_b$, it is possible to reduce a voltage drop.

Even with this constitution, it is possible to reduce the voltage drop and to provide the organic LED element with high efficiency. Moreover, in a case where the second electrode is the reflective electrode using a metal, irregularities of light emission resulting from the voltage drop is considered to be similar to when the light emitting area increases; therefore, the present method is considered to be effective similarly to the case where the second electrode is translucent.

The same processes shown in FIGS. 2(a) to 2(d) can also be applied when producing the organic LED element.

Embodiment 3

Figure 4A:
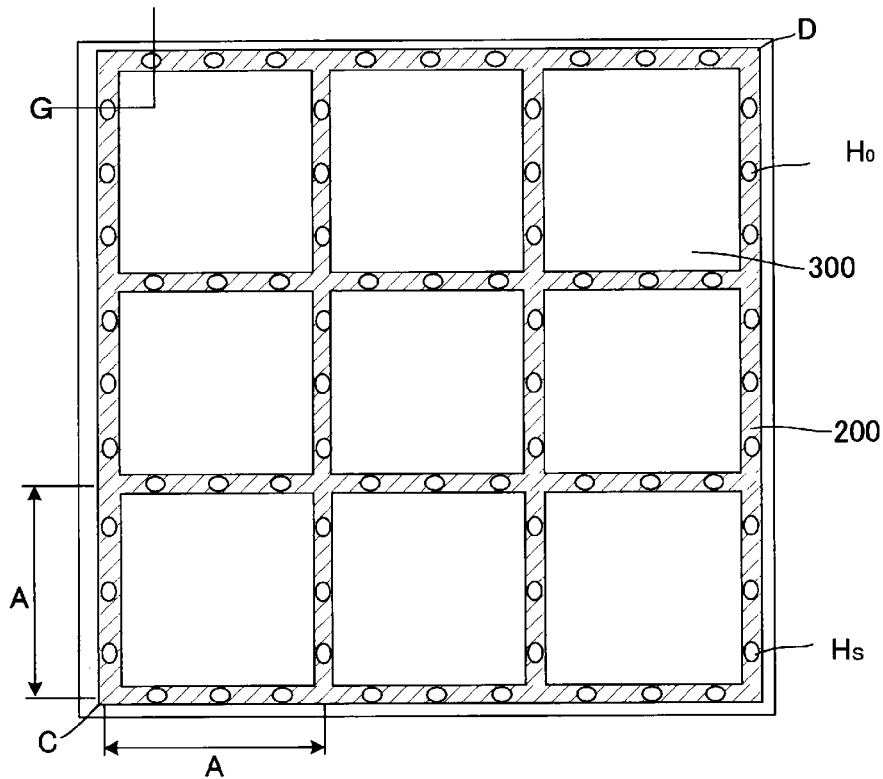
FIG. 4(a) is a plan view of the substrate for the electronic device.
Figure 4B:
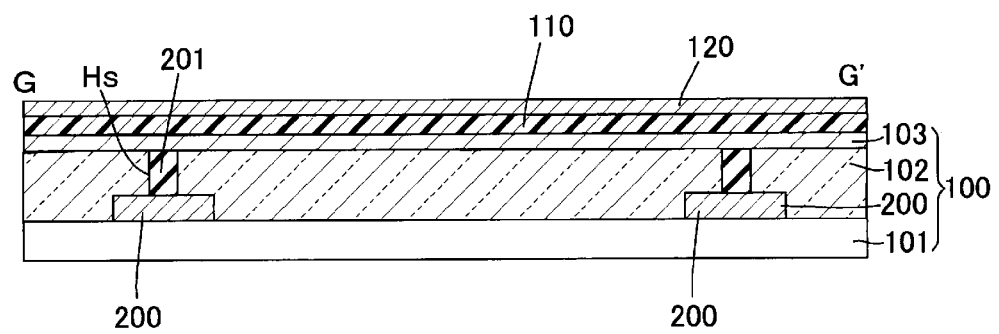
FIG. 4(b) is a cross sectional view of the organic LED element.

Next, the substrate for the electronic device and the organic LED element using the same of Embodiment 3 of the invention will be described. FIG. 4(a) is a plan view of the substrate for the electronic device, and FIG. 4(b) is a cross sectional view of G-G' surface showing the organic LED element formed on the substrate for the electronic device.

The substrate for the electronic device for forming the organic LED element of the invention includes different shapes of through-holes. The through-hole has the shape with tapered cross section in Embodiment 1; however, in the present embodiment, a through-hole $H_s$ with a vertical cross section is formed and filled with a conductive paste 201. Other constitutions thereof are the same as Embodiment 1.

With this constitution, it is possible to reduce the area required for forming the through-hole $H_s$ and to achieve the reduction of area occupied by the substrate.

At the time of production, a glass layer pattern having the through-hole is printed and temporarily fired, and then the conductive paste 201 is filled in the through-hole $H_s$. Thereafter, the resultant is actually fired, and then the surface thereof is polished to obtain a smooth surface without steps. When the conductive paste 201 is filled and fired, if there are almost no steps on the surface of the glass layer 102, it is not necessary to polish the surface. However, when there are steps, it is desirable to polish the surface since the polishing makes it difficult for the interelectrode short circuit and the irregularities of light emission to occur when the electronic device is formed. Here, when the surface is polished, it is necessary to use a method in which the fine unevenness resulting from the roughness of the surface does not occur.

Subsequently, the resultant is used as a starting material to form the electronic device by forming electrodes on the surface thereof.

Next, a process for producing the substrate for the electronic device and the electronic device using the same will be described.

First, the glass substrate 101 is prepared, and the surface thereof is polished if necessary. Thereafter, through screen printing, the auxiliary wiring pattern 200 with a paste film thickness of 80 μm and a line width of 200 μm is formed which includes silver as a main component, in a similar manner as in the Embodiment 1.

Since the surface of the glass substrate 101 is subsequently polished in this example, it is desirable that the film thickness of the auxiliary wiring is about 0.5 to 5 μm.

Thereafter, by printing the glass paste on the entire surface of the glass substrate 101 through the screen printing, the glass layer 102 is formed.

Figure 5A:
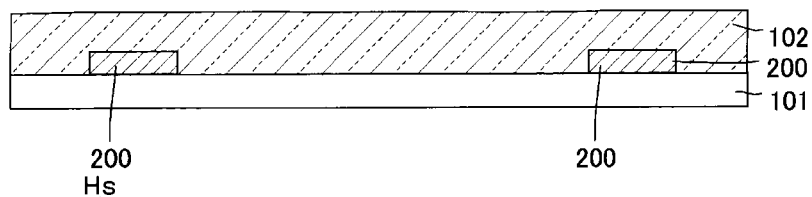
FIG. 5 are views of production steps of the organic LED element of the embodiment 3 of the invention.

Then, by performing firing, the substrate for the electronic device in which the auxiliary wiring pattern is coated with the glass layer is formed as shown in FIG. 5(a). At this point of time, the auxiliary wiring 200 is covered with the glass layer 102. Also, in the end portion of the auxiliary wiring 200 extracted outside, the glass layer 102 may not be formed.

Figure 5B:
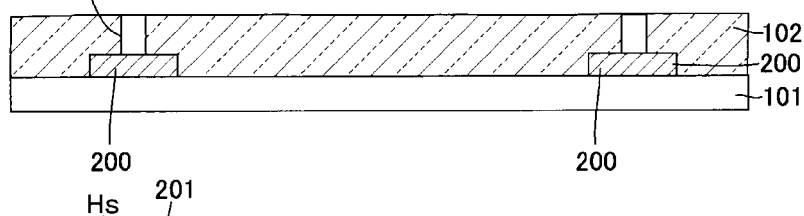

Subsequently, as shown in FIG. 5(b), the through-hole $H_s$ of 80 μm φ is formed by a laser in the glass layer 102 in the portion of the auxiliary wiring pattern.

Figure 5C:
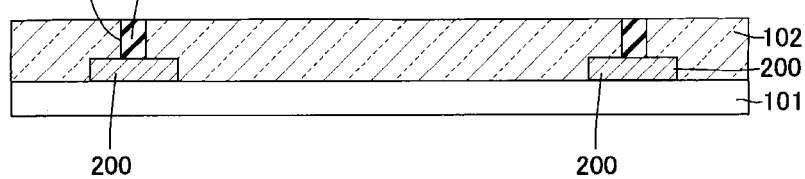

Thereafter, as shown in FIG. 5(c), a silver paste as the conductive paste 201 is filled in the through-hole $H_s$, followed by firing, and a smooth surface is obtained by polishing the surface.

Figure 5D:
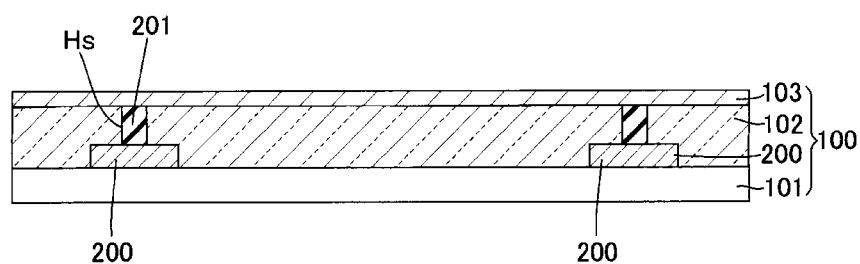

Next, the ITO film as the translucent electrode 103 is formed on the entire surface of the resultant obtained above, and as shown in FIG. 5(d), the electrode-attached substrate 100 for the electronic device is obtained.

Figure 5E:
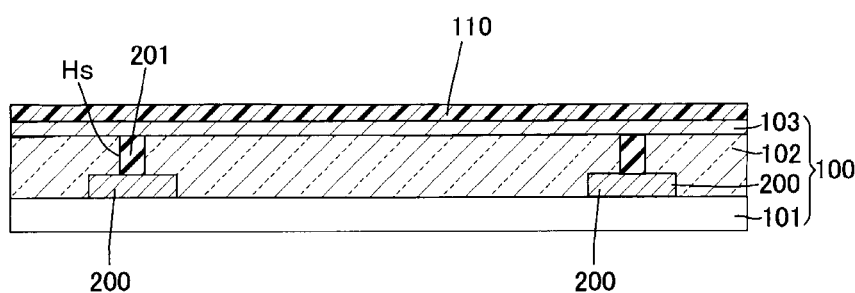

Then, as shown in FIG. 5(e), the layer 110 such as the hole-injection layer, the light-emitting layer, the electron-injection layer or the second electrode having the light-emitting function is formed by the coating method or the like.

Finally, after an aluminum layer as the second electrode is formed by the sputtering method, the aluminum layer on the through-hole $H_s$ is removed by photolithography as necessary, and the aluminum electrode as the reflective electrode 120 is formed on the layer 110 having the light-emitting function.

Sputtering may be performed by mask sputtering or the like so that the aluminum layer is not formed on the through-hole $H_s$. It is desirable that the second electrode is not formed on the through-hole $H_s$ since the interelectrode short circuit does not easily occur.

According to the embodiment, by filling the conductive member in the through-hole formed by the laser, smoothing the surface by surface polishing as necessary, and then forming the translucent electrode on the surface of the smooth glass layer, it is possible to electrically connect the translucent electrode and the through-hole.

With this constitution, not only the light-emitting area can be enlarged by the miniaturization of the through-hole, but also the surface can be further smoothed. Therefore, when the organic LED element is formed, it is possible to form the highly reliable element on the entire smooth surface in an integrated manner.

In the substrate for the electronic device of the embodiment, the through-hole may be regularly formed on the auxiliary wiring of the surface at predetermined intervals. However, the through-hole may be formed in accordance with the device which will be formed thereon, and the conductive member may be formed in a portion of the through-hole.

Figure 6A:
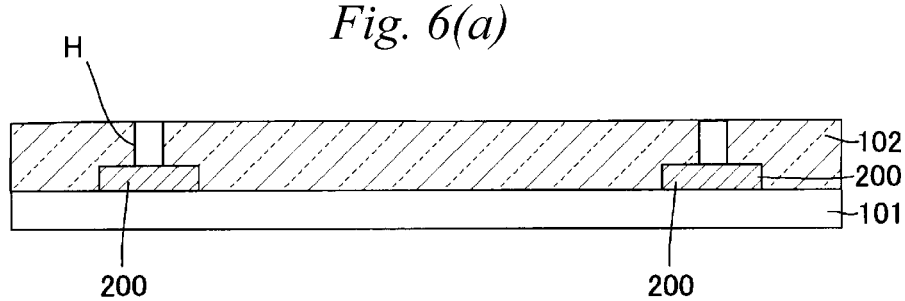
FIG. 6 are views showing a modification example of the substrate for the electronic device of the embodiment 3 of the invention.
Figure 6B:
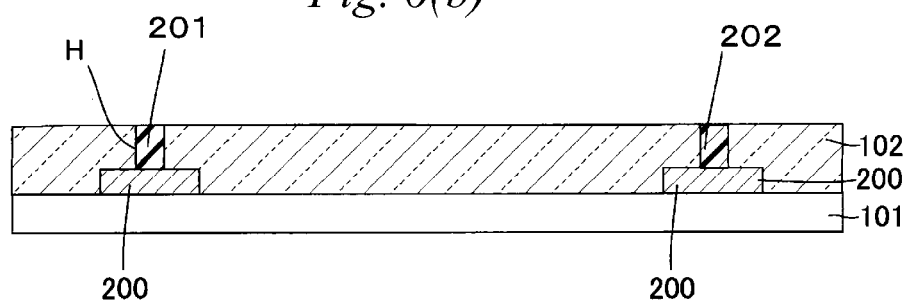

Meanwhile, as the modification example shown in FIG. 6(a), the auxiliary wiring-attached glass substrate in which the through-hole H is formed at a predetermined interval may be formed in advance. Also, as shown in FIG. 6(b), the conductive paste 201 may be embedded in the site electrically connected to the functional element to be formed thereon, and an insulating member 202 may be embedded in the site not electrically connected to the functional element, and the resultant may be fired after the glass layer is fired or at the same time when the glass layer is fired. By polishing the surface finally, it is also possible to further smooth the surface. In this manner, it is possible to improve the characteristic of the electronic device to be formed thereon and to prolong the lifetime of the electronic device.

Embodiment 4

Figure 7A:
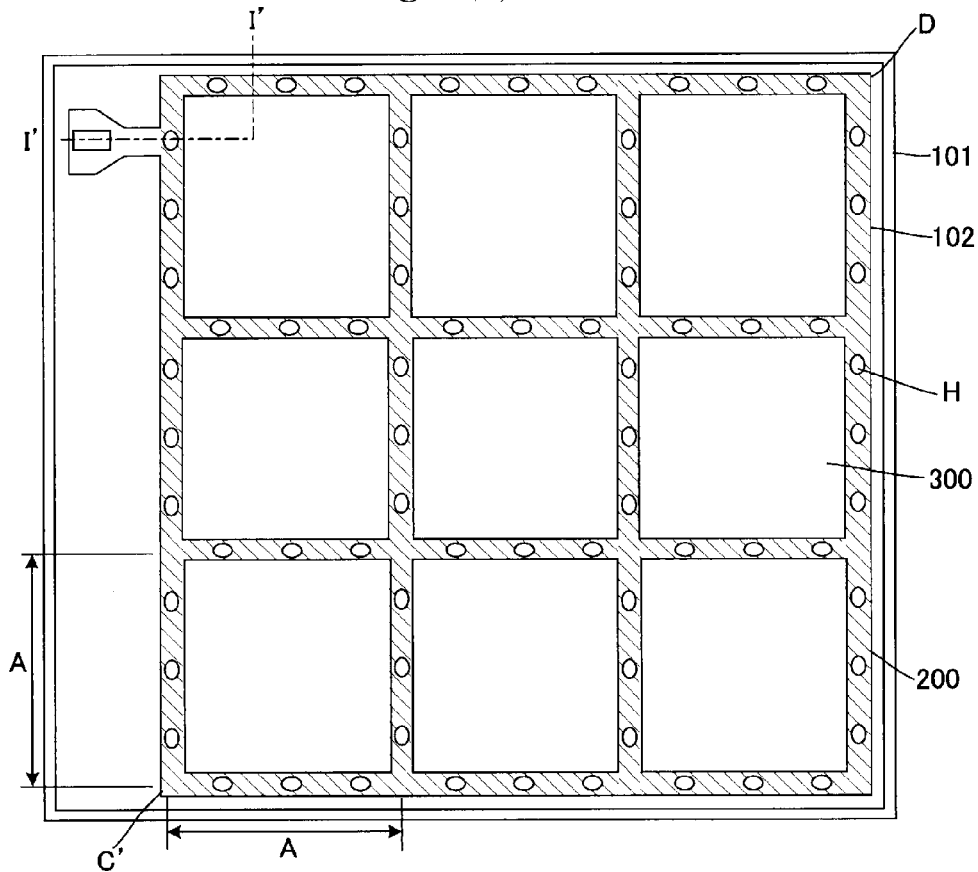
FIG. 7(a) is a plan view of the substrate for the electronic device.
Figure 7B:
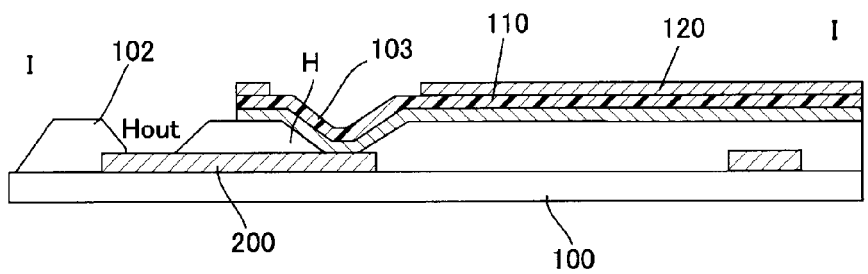
FIG. 7(b) is a cross sectional view of the organic LED element.

Next, as Embodiment 4 of the invention, the organic LED element including the substrate for the electronic device will be described. FIG. 7(a) is a plan view of the substrate for the electronic device of the embodiment of the invention, and FIG. 7(b) is a view of I-I' cross section showing the organic LED element formed on the substrate for the electronic device.

The substrate for the electronic device for faulting the organic LED element of the invention is formed in the same manner as the substrate for the electronic device described in Embodiment 1. However, an external connection terminal (not shown) led to the outside of a sealing portion is also formed through a through-hole $H_{out}$.

Other portions of the substrate are formed in the same manner as the Embodiment 1.

With this constitution, the external connection terminal portion starting from the element region, passing through the sealing portion, and formed to the vicinity of the edge of the glass substrate is formed in the same process and manner as the internal through-hole H.

Other constitutions are the same as Embodiment 1. Also, as the external connection terminal, a plating layer may be formed to enable bonding, or a bump may also be formed.

With this constitution, the external connection is made easy, and the reliability is improved.

At the time of the production, by simply adjusting the formation position of the auxiliary wiring pattern and the through-hole, the external connection can be easily performed.

Examples of the glass used for the glass layer herein include a $B_2O_3$—$SiO_2$—$ZnO$ system, a $B_2O_3$—$SiO_2$—$PbO$ system, a $B_2O_3$—$P_2O_5$—$ZnO$ system and the like. Meanwhile, the refractive index of the organic layer having the light-emitting function is from about 1.8 to about 2.1 at 430 nm. On the other hand, the refractive index of the translucent electrode layer is generally from about 1.9 to about 2.1. Like this, the organic layer and the translucent electrode layer are close to each other in refractive index, so that emitted light reaches an interface between the translucent electrode layer and a translucent substrate without totally reflecting between the organic layer and the translucent electrode layer. The refractive index of the general glass substrate is from about 1.5 to about 1.6, which is lower in refractive index than the organic layer or the translucent electrode layer.

Light which tries to enter the glass substrate at a shallow angle is reflected by total reflection in an organic layer direction, and reflected again at a reflective electrode to reach the interface of the glass substrate. At this time, the incident angle to the glass substrate does not vary, so that reflection is repeated in the organic layer and the translucent electrode layer to fail to extract the light from the glass substrate to the outside.

Accordingly, the amount of the light which can be extracted to the outside of the organic LED element is less than 20% of the emitted light in the present circumstances.

By allowing the glass layer of the invention to have the light scatterability, it is possible to improve the light-extraction efficiency. This is because the light propagating in the element changes its direction by scattering, whereby the probability that the light is emitted outside increases. Also, even when the light propagates in the element at an angle at which the light cannot be extracted to the outside, since the light is reflected at the reflective electrode and reaches the glass scattering layer again, the light can be extracted to the outside during the repetition of such a movement. In this case, it is desirable that the refractive index of the glass scattering layer is equal to or more than that of the translucent electrode connected to the glass scattering layer.

Specifically, it is desirable that the refractive index of the glass of the glass scattering layer is 1.8 or more at a certain light-emitting wavelength.

In this case, as a desirable glass material, it is possible to use a high refractive index glass containing one or two or more kinds of components selected from $P_2O_5$, $SiO_2$, $B_2O_3$, $Ge_2O$ and $TeO_2$ as network formers, and one or two or more kinds of components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as high refractive index components.

As the scattering material, pores, crystalline precipitates or the like is considered. Also, by providing waviness on the glass surface, it is possible to prevent the reflection of the reflective electrode. In the organic LED element, a thin film for forming the element is formed by tracing the waviness of the ground in general. Therefore, when the substrate is flat, if the reflective electrode is used, the surface becomes a mirror-like form, hence the reflection occurs. Accordingly, by providing waviness on the surface of the glass layer, it is possible to inhibit the reflection by making the reflective electrode have waviness.

Figure 8A:
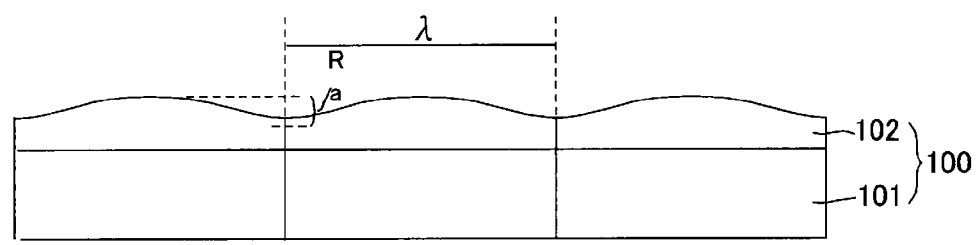
FIG. 8(a) is an illustrative view of a cross section showing the state of the waviness.
Figure 8B:
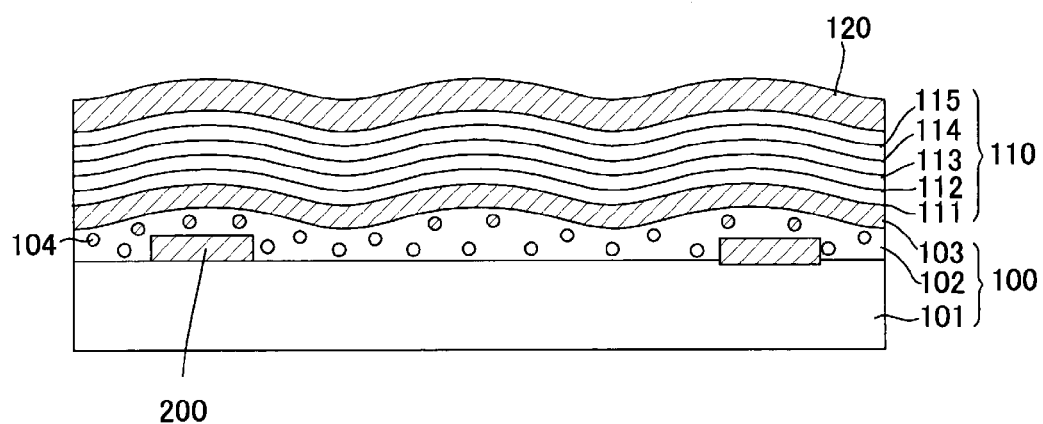
FIG. 8(b) is an illustrative view of a cross section showing the state of the organic LED element.

FIG. 8 is a cross sectional illustrative view of an example in which the waviness is provided on the surface of the glass layer. FIG. 8(a) is a cross sectional illustrative view showing a state where the glass substrate 101 and the glass layer 102 are provided with the waviness to describe the relationship between the wavelength λ and the surface roughness Ra, and for better understanding, the auxiliary wiring is not shown in the drawing. FIG. 8(b) is a cross sectional illustrative view showing the state of the organic LED element, and it shows the glass substrate 101, the glass layer 102, the translucent electrode 103, a scattering material 104, a hole-injection layer 111, a hole-transport layer 112, the light-emitting layer 113, an electron-transport layer 114, an electron-injection layer 115, the reflective electrode 120, and the auxiliary wiring pattern 200.

The electrode-attached translucent substrate 100 includes the glass substrate 101, the glass layer 102 containing the scattering material 104, and the auxiliary wiring pattern 200, and the surface thereof has waviness. Also, an organic layer 110 formed on the electrode-attached translucent substrate 100 has the light-emitting function. The organic layer 110 includes the hole-transport layer 112, the light-emitting layer 113, the electron-transport layer 114, the electron-injection layer 115 and the reflective electrode 120, and each of these layers has the waviness.

Specifically, at a cutoff wavelength 10 μm, it is desirable that a ratio Ra/Rλa of the surface roughness Ra (JIS B0601-1994) of the surface of the glass scattering layer to a wavelength Rλa of the surface waviness is from $1.0 \times 10^{-6}$ to $3.0 \times 10^{-5}$. By making the ratio within this range, the scattering characteristic can be improved by the waviness even if the scattering characteristic of the glass layer 102 is not sufficient, and accordingly, it is possible to improve the appearance since the reflective electrode 120 is not easily seen when unlit. Detailed description thereof will be made later.

Also, in order to prevent the interelectrode short circuit of the organic LED element, the surface of the scattering layer is required to be smooth. The surface roughness Ra of the surface constituting the waviness is desirably 30 nm or less, and particularly desirably 10 nm or less. The organic LED element includes the auxiliary wiring and translucent electrode-attached translucent substrate 100 having the waviness and used as the substrate for the electronic device, the organic layer 110, and the reflective electrode 120. The electrode-attached translucent substrate 100 includes the substrate 101 formed of translucent glass substrate, the glass layer 102, and the translucent electrode 103.

By taking this range, it is possible to make the film thickness of the translucent electrode 103 uniform and to make the distance between the electrodes uniform. Accordingly, the field concentration can be inhibited, hence the lifetime of the element can be prolonged.

It is desirable that the auxiliary wiring and translucent electrode-attached translucent substrate 100 (as the substrate for the electronic device) used in the invention includes the translucent glass substrate 101, the glass layer 102 formed on the glass substrate and having the scattering characteristic, and the translucent electrode 103. That is, it is desirable that the glass layer includes a base material having a first refractive index for one wavelength of light to be transmitted and a plurality of pieces of scattering material 104 dispersed in the base material and having a second refractive index different from that of the base material, thereby having scatterability. Particularly, it is desirable that the distribution of the scattering material in the glass layer decreases from the inside of the glass layer toward the translucent electrode. Also, it is desirable that the translucent electrode 103 has a third refractive index equal to or lower than the first refractive index.

With this constitution, it is possible to efficiently guide the emitted light to the glass substrate side and to improve a light-extracting characteristic.

As described above, in order to prevent the interelectrode short circuit of the organic LED element, the surface of the glass layer with the scatterability is required to be smooth. For that purpose, it is not desirable that the scattering material protrudes from the main surface of the scattering layer. Also in order to prevent the scattering material from protruding from the surface of the glass layer, it is desirable that the scattering material is not present within 0.2 µm from the surface of the glass layer. For this purpose, the density $\rho_1$ of the scattering material at a half thickness ($\delta/2$) of the glass layer 102 and the density $\rho_2$ of the scattering material in the portion close to the surface of the glass layer at the side adjacent to the translucent electrode satisfy $\rho_1 > \rho_2$. With this constitution, it is possible to improve the scatterability while maintaining the surface smoothness.

Particularly, within a distance x ($x \leq 0.2$ µm) from the surface of the translucent electrode side, which is the portion close to the surface of the translucent electrode side of the glass layer, it is desirable that the scattering material is not present.

Although the glass layer is directly formed on the glass substrate, it may be formed with the interposition of a barrier layer, for example, such that a thin silica film is formed on the glass substrate by a sputtering method or the like, and then the glass layer is formed thereon. However, an extremely stable and flat surface can be obtained by forming the glass layer with no interposition of an adhesive or an organic layer on the glass layer. Moreover, it is possible to form a thermally stable and long-life optical device by constituting it only with inorganic materials.

Characteristics of such a translucent substrate will be described in detail.

When glass powder is fired to form the glass layer, the glass powder is applied on the glass substrate through a suitable method. For example, by dispersing glass particles in a solvent or a mixture of a resin and a solvent and applying the resulting dispersion to a desired thickness, the glass layer is obtained. For example, the glass particles having a size of about 0.1 to about 10 µm in terms of the maximum length are used. When the resin and the solvent are mixed, if a resin membrane in which the glass particles are dispersed is heated to decompose the resin, a space is created between the glass particles.

When the temperature rises further, the glass particles start to be fused to one another at a temperature 10° C. to 20° C. lower than the softening temperature of the glass. When the glass particles are fused to one another, the space formed between the glass particles is deformed by softening of the glass to form a closed space in the glass. On outermost layers of the glass particles, the surface of the glass layer is formed by the interfusion of the glass particles. On the surface, the space which does not form the closed space remains as a depression.

When the temperature is raised further, softening and fluidity of the glass proceeds, and the space in the glass forms spherical pores. On the surface of the glass layer, the depressions caused by the spaces between the glass particles are smoothed. Not only the pores due to the spaces between the glass particles, but also pores are formed by generation of a gas at the time when the glass is softened, in some cases. For example, when an organic material is adhered to the surface of the glass layer, it decomposes to generate $CO_2$, thereby forming pores in some cases. Further, a thermally decomposable material may be introduced to actively generate pores. Such a state is usually obtained in the vicinity of the softening temperature. The viscosity of the glass is as high as $10^{7.6}$ poise at the softening temperature, so that the pores cannot rise to the surface in the case where the size of the pores is several µm or less. Accordingly, it is possible to further smooth the surface while inhibiting the pores from rising to the surface by adjusting the material composition so as to generate small pores and by adjusting the firing temperature or by prolonging the retention time. When cooled from the state in which the surface is smoothed in this way, a glass layer with the scatterability is obtained in which the density of the scattering material is smaller in the inside of the glass layer than in the surface thereof and which has a smooth surface.

In this way, it is possible to inhibit the generation of the pores and depressions in the surface of the glass layer while leaving the pores in the glass layer by adjusting the material composition and firing temperature for forming the glass layer. Namely, it is possible to provide the electrode-attached translucent substrate excellent in scattering characteristics and high in surface smoothness by adjusting the firing temperature profile and adjusting the firing time so as to prevent the scattering material from rising and to leave the pores in the glass layer not risen to the surface. Also, it is possible to produce a translucent glass layer almost not having the scatterability according to the selection of the material, glass layer thickness, firing conditions or the like.

At this time, the outermost surface of the glass layer can also form a curved surface having waviness. The waviness as used herein has a period $\lambda$ of the wavelength of the waviness of 10 µm or more. The size of the waviness is from about 0.01 µm to about 5 µm in terms of Ra. Even when such waviness is present, the microscopic smoothness is maintained. In order to form such a waviness, it is necessary to select a treatment temperature, glass material composition, the size of glass particles, a substrate material or the like. When the treatment temperature is low, a microscopic concave portion of the surface of the glass layer is left in some cases. However, the shape of the concave portion becomes gentle by prolonging the firing time. The term gentle means that the diameter of the opening of the concave portion is equal to or larger than that of the internal space of the concave portion. When the shape is gentle as described above, it is said that the possibility that this concave portion causes an interelectrode short circuit of the organic LED element is low. The firing temperature is desirably about 40° C. to about 60° C. higher than the glass transition temperature. A too low temperature causes insufficient firing, resulting in failure to smooth the surface. Accordingly, the firing temperature is more desirably about 50° C. to about 60° C. higher than the glass transition temperature.

Further, in the glass layer, the surface forms waviness constituting a curved surface, thereby being able to inhibit the appearance from being spoiled by reflection, when the organic LED element formed on the upper layer is a reflective electrode. When the reflective electrode is used, there has been a problem in that the appearance is spoiled by reflection due to the reflective electrode at the time of non-light emission. However, according to the invention, by making the suitable conditions when the glass layer is formed, the accuracy of a pattern formed on the upper layer is not deteriorated, variation does not occur in interelectrode distance, and the contact area of the electrode and the layer having a light-emitting function can be increased. Accordingly, the effective element area can be increased, thereby being able to form the long-life, high-luminance organic LED element.

When the organic LED element is formed on such a translucent substrate, for example, the translucent electrode is necessary to be thinly formed. It is at a surface roughness of 30 nm or less, desirably 10 nm or less that this translucent electrode can be formed without being affected by a ground. When the surface roughness exceeds 30 nm, coatability of the organic layer formed thereon deteriorates in some cases, and a short circuit occurs between the translucent electrode formed on the glass layer and another electrode in some cases.

The interelectrode short circuit causes non-lighting of the element, but it is possible to restore it by applying an overcurrent in some cases. In order to enable the restoration, the roughness of the glass layer is desirably 10 nm or less, and more desirably 3 nm or less.

Although the optimum firing conditions vary depending on the material system, the scattering material is inhibited from being present in the outermost surface by controlling the kind or size of scattering material, thereby being able to obtain the glass layer with an excellent surface smoothness.

Further, regarding the size of the scattering material, when the pores are present in the glass layer, an increase in size of the pores increases buoyancy in a glass layer forming process such as firing, whereby the pores can easily rise to the surface. When the pores reach the surface of the glass layer, there is the possibility that they will burst to significantly deteriorate the surface smoothness. Furthermore, the number of pieces of the scattering material relatively decreases in that portion, so that scatterability decreases only in that portion. Coagulation of such large pores also results in unevenness which is visually recognized.

Accordingly, the ratio of the pores having a diameter of 5 μm or more is desirably 15 vol % or less, more desirably 10 vol % or less, and still more desirably 7 vol % or less. In addition, even when the scattering material is other than the pores, the number of pieces of the scattering material relatively decreases in that portion, so that scatterability decreases only in that portion. Accordingly, the ratio of the scattering material having a maximum length of 5 μm or more is desirably 15 vol % or less, more desirably 10 vol % or less, and still more desirably 7 vol % or less.

When the reflective electrode is used, there has been a problem in that the appearance is spoiled by reflection due to the reflective electrode at the time of non-light emission. However, by optimizing the conditions when the glass layer is formed, it is possible to reduce the reflection by forming a waviness shape on the surface of the glass layer.

Further, using the easily crystallizable glass makes it possible to precipitate crystals in the glass layer. At this time, when the size of the crystals is 0.1 μm or more, they function as the light scattering material. A suitable selection of the firing temperature makes it possible to precipitate the crystals in the glass layer while inhibiting the precipitation of the crystals in the surface of the glass layer. Specifically, it is desirable that the temperature is about 60° C. to about 100° C. higher than the glass transition temperature. If the temperature increases to about this range, the viscosity of the glass becomes high, and the pores do not easily rise to the surface.

When the temperature is too high, the crystals also precipitate in the surface of the glass layer, and the smoothness of the surface is lost. This is therefore unfavorable. Accordingly, the firing temperature is more desirably about 60° C. to about 80° C. higher than the glass transition temperature, and still more desirably about 60° C. to about 70° C. higher than the glass transition temperature. Such a technique makes it possible to allow the pores and the precipitated crystals to exist in the glass layer as the scattering material and to inhibit the generation thereof in the surface of the glass layer. The reason why these are possible is that the glass is itself flattened within the certain temperature range, and that high viscosity at which the pores do not rise to the surface can be realized or the crystals can be precipitated. In the case of a resin, it is difficult to control the process at high viscosity as described above and to precipitate the crystals.

As described above, by adjusting the material composition and the firing conditions, it is possible to obtain the translucent substrate in which the density of the scattering material in the surface of the glass layer is lower than the density of the scattering material in the glass layer.

Further, by using a translucent substrate in which the density $\rho_1$ of the scattering material at a half thickness of the glass layer and the density $\rho_2$ of the scattering material in a portion close to the surface of the glass layer satisfy $\rho_1 > \rho_2$, it is possible to obtain the translucent substrate having sufficient scattering characteristics and a smooth surface.

Furthermore, there are the case where the scattering material is pores, the case where it is material particles having a composition different from that of the base layer and the case where it is precipitated crystals of the base layer. These may be used alone or in a mixture thereof.

When the scattering material is pores, the size of the pores, pore distribution or density can be adjusted by adjusting the firing conditions such as the firing temperature.

When the scattering material is material particles having a composition different from that of the base layer, the size, distribution or density of the scattering material can be adjusted by adjusting the material composition or the firing conditions such as the firing temperature.

When the scattering material is precipitated crystals of the glass constituting the base layer, the size of the pores, pore distribution or density can be adjusted by adjusting the firing conditions such as the firing temperature.

Further, the first refractive index of the base layer for at least one wavelength of wavelengths λ (430 nm<λ<650 nm) is desirably 1.8 or more. Although it is difficult to form a high refractive index material layer, it becomes easy to adjust the refractive index by adjusting the material composition of the glass material.

The respective members will be described in detail below.

<Substrate>

As a translucent substrate used for the formation of the translucent substrate, a glass substrate is used. As a material for the glass substrate, there is an inorganic glass such as alkali glass, non-alkali glass or quartz glass. The thickness of the glass substrate 101 is desirably from 0.1 mm to 2.0 mm. However, since an excessively thin substrate results in a decrease in strength, it is particularly desirable that the thickness is from 0.5 mm to 1.0 mm.

Also, in order to prepare the glass layer using glass frit, the thermal expansion coefficient is $50 \times 10^{-7}/°$ C. or more, desirably $70 \times 10^{-7}/°$ C. or more and still more desirably $80 \times 10^{-7}/°$ C. or more, because a problem of strain and the like occur.

Further, it is desirable that the average thermal expansion coefficient of the glass layer at 100° C. to 400° C. is from $70 \times 10^{-7}$ (° C.$^{-1}$) to $95 \times 10^{-7}$ (° C.$^{-1}$), and that the glass transition temperature is from 450° C. to 550° C.

<Glass Layer>

The waviness on the surface of the glass layer has already been described as above. Next, a constitution, a preparation method and characteristics of the glass layer and a measuring method of the refractive index will be described in detail. Also, although the detailed description will be made later, in order to realize an improvement of the light-extraction efficiency which is the principal object of the organic LED element, it is desirable that the refractive index of the glass layer is equivalent to or higher than the refractive index of a translucent electrode material.

(Constitution)

In this embodiment, as described above, the glass layer 102 is formed by forming a glass powder on the glass substrate by a method such as coating and firing the resultant at a desired temperature. The glass layer formed in this way has the base material 102 having the first refractive index and the scattering material 104 dispersed in the base material 102 and having the second refractive index different from that of the base material. The intralayer distribution of the scattering material in the glass layer decreases from the inside of the glass layer to the surface. Use of the glass layer makes it possible to keep smoothness of the surface while having excellent scattering characteristics, as described above. Therefore, use of the glass layer on the light outgoing surface side of the light-emitting device or the like makes it possible to realize extremely high-efficiency light extraction.

Further, as the glass layer, a material (base material) having a main surface coated and having a high light transmittance may be used. As the base material, various glasses, and a crystallized glass are used. Furthermore, the scattering material 104 (for example, pores, precipitated crystals, material particles different from the base material or phase-separated glass) are formed in the base material. The particles herein refer to a small solid material, and examples thereof include a filler or a ceramic. Further, the pores refer to air or gas material. Furthermore, the phase-separated glass refers to a glass constituted with two or more kinds of glass phases. In addition, when the scattering material is the pores, the diameter of the scattering material refers to a length of a void.

Further, in order to realize an improvement of the light-extraction efficiency which is the principal object of the invention, it is desirable that the refractive index of the base material is equivalent to or higher than the refractive index of the translucent electrode material. When the refractive index is low, a loss due to total reflection occurs at an interface between the base material and the translucent electrode material. The refractive index of the base material may exceed for at least one portion (for example, red, blue, green or the like) in the emission spectrum range of the light-emitting layer. However, it exceeds desirably over the whole region (430 nm to 650 nm) of the emission spectrum range, and more desirably over the whole region (360 nm to 830 nm) of the wavelength range of visible light.

Further, in order to prevent the interelectrode short circuit of the organic LED element, it is desirable that the main surface of the glass layer is smooth. For that purpose, it is undesirable that the scattering material protrudes from the surface of the side of the glass layer adjacent to the translucent electrode. In order to prevent the scattering material from protruding from the surface of the glass layer, it is desirable that the scattering material is not present within 0.2 μm from the surface of the glass layer. The average roughness (Ra) of the surface of the glass layer is desirably 30 nm or less, more desirably 10 nm or less, and particularly desirably 1 nm or less. Although both the refractive indexes of the scattering material and the base material may be high, the difference (Δn) in the refractive indexes is desirably 0.2 or more for at least one portion in the emission spectrum range of the light-emitting layer. In order to obtain sufficient scattering characteristics, the difference (Δn) in the refractive indexes is more desirably 0.2 or more over the whole region (430 nm to 650 nm) of the emission spectrum range or the whole region (360 nm to 830 nm) of the wavelength range of visible light.

In order to obtain the maximum refractive index difference, it is desirable to employ the constitution in which a high refractive index glass is used as the high light transmittance material and the gas material, namely the pores, is used as the scattering material. In this case, since the refractive index of the base material is desirably as high as possible, it is desirable to use the high refractive index glass as the base material. For components of the high refractive index glass, it is possible to use the high refractive index glass containing one or two or more kinds of components selected from $P_2O_5$, $SiO_2$, $B_2O_3$, $Ge_2O$ and $TeO_2$ as network formers, and one or two or more kinds of components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as high refractive index components. In addition, in a sense of adjusting characteristics of the glass, an alkali oxide, an alkaline earth oxide, a fluoride or the like may be used within the range not impairing characteristics required for the refractive index. Specific glass systems include a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, a $P_2O_5$—$ZnO$ system and the like, wherein R' represents an alkali metal element, and R" represents an alkaline earth metal element. Also, the above are examples, and the glass system is not limited to these examples as long as it is constituted so as to satisfy the above-mentioned conditions.

It is also possible to change color of light emission by allowing the base material to have a specific transmittance spectrum. As colorants, known ones such as a transition metal oxide, a rare-earth metal oxide and a metal colloid can be used alone or in combination thereof.

(Preparation Method of Glass Layer)

The preparation of the glass layer is carried out by coating and firing. In particular, from the viewpoint of rapidly and uniformly forming the glass layer having a film thickness of 10 to 100 μm into a large area and with the waviness, a method of preparing the layer by using a frit-pasted glass is desirable. In order to utilize a frit paste method, it is desirable that the softening point (Ts) of the glass of the glass layer is lower than the strain point (SP) of the glass substrate, and that the difference in the thermal expansion coefficient α is small, for inhibiting thermal deformation of the glass substrate. The difference between the softening point and the strain point is desirably 30° C. or more, and more desirably 50° C. or more. Further, the difference in the expansion coefficient between the glass layer and the glass substrate is desirably $\pm 10 \times 10^{-7}$ (1/K) or less, and more desirably $\pm 5 \times 10^{-7}$ (1/K) or less. The frit paste used herein indicates one in which a glass powder is dispersed in a resin, a solvent, a filler or the like. Glass layer coating becomes possible by patterning the frit paste using a pattern forming technique such as screen printing and firing it. The technical outline will be described below.

(Frit Paste Material)

1. Glass Powder

The particle size of the glass powder is from 1 μm to 10 μm. In order to control the thermal expansion of the fired film, a filler is incorporated in some cases. As the filler, specifically, zircon, silica, alumina or the like may be used, and the particle size thereof is from 0.1 μm to 20 μm.

Glass materials will be described below.

In the invention, a glass layer containing 20 to 30 mol % of $P_2O_5$, 3 to 14 mol % of $B_2O_3$, 10 to 20 mol % of $Li_2O$, $Na_2O$ and $K_2O$ in terms of total amount thereof, 10 to 20 mol % of $Bi_2O_3$, 3 to 15 mol % of $TiO_2$, 10 to 20 mol % of $Nb_2O_5$ and 5 to 15 mol % of $WO_3$, wherein the total amount of the above-mentioned components is 90 mol % or more, is used as the glass layer.

The glass composition for forming the glass layer is not particularly limited, as long as desired scattering characteristics are obtained and it can be frit-pasted and fired. However, in order to maximize the extraction efficiency, examples thereof include a system containing $P_2O_5$ as an essential component and further one or more components of $Nb_2O_5$, $Bi_2O_3$, $TiO_2$ and $WO_3$; a system containing $B_2O_3$, $ZnO$ and $La_2O_3$ as essential components and one or more components of $Nb_2O_5$, $ZrO_2$, $Ta_2O_5$ and $WO_3$; a system containing $SiO_2$ as an essential component and one or more components of $Nb_2O_5$ and $TiO_2$; a system containing $Bi_2O_3$ as a main component and $SiO_2$, $B_2O_3$ and the like as network-forming components, and the like.

Also, in all glass systems used as the glass layer in the invention, $As_2O_3$, PbO, CdO, $ThO_2$ and HgO which are components having adverse effects on the environment are not included, except for the case where impurities derived from raw materials are inevitably mixed therewith.

The glass layer containing $P_2O_5$ and one or more components of $Nb_2O_5$, $Bi_2O_3$, $TiO_2$ and $WO_3$ is desirably a glass within the composition range of 15 to 30% of $P_2O_5$, 0 to 15% of $SiO_2$, 0 to 18% of $B_2O_3$, 5 to 40% of $Nb_2O_5$, 0 to 15% of $TiO_2$, 0 to 50% of $WO_3$, 0 to 30% of $Bi_2O_3$, provided that $Nb_2O_5+TiO_2+WO_3+Bi_2O_3$ is from 20 to 60%, 0 to 20% of $Li_2O$, 0 to 20% of $Na_2O$, 0 to 20% of $K_2O$, provided that $Li_2O+Na_2O+K_2O$ is from 5 to 40%, 0 to 10% of MgO, 0 to 10% of CaO, 0 to 10% of SrO, 0 to 20% of BaO, 0 to 20% of ZnO and 0 to 10% of $Ta_2O_5$, in terms of mol %.

Effects of the respective components are as follows in terms of mol %.

$P_2O_5$ is an essential component forming a framework of this glass system and performing vitrification. However, when the content is too small, devitrification of the glass increases to result in failure to obtain the glass. Accordingly, the content is desirably 15% or more, and more desirably 18% or more. On the other hand, when the content is too high, the refractive index decreases to result in failure to achieve the object of the invention. Accordingly, the content is desirably 30% or less, and more desirably 28% or less.

$B_2O_3$ is an optional component as a component which is added into the glass, thereby improving resistance to devitrification and decreasing the thermal expansion coefficient. When the content is too high, the refractive index decreases. Therefore the content is desirably 18% or less, and more desirably 15% or less.

$SiO_2$ is an optional component as a component which is added in slight amounts, thereby stabilizing the glass and improving resistance to devitrification. When the content is too high, the refractive index decreases. Therefore, the content is desirably 15% or less, more desirably 10% or less, and particularly desirably 8% or less.

$Nb_2O_5$ is an essential component improving the refractive index and also having an effect of enhancing weather resistance at the same time. Accordingly, the content is desirably 5% or more, and more desirably 8% or more. On the other hand, when the content is too high, devitrification increases to result in failure to obtain the glass. Accordingly, the content thereof is desirably 40% or less, and more desirably 35% or less.

$TiO_2$ is an optional component improving the refractive index. However, when the content is too high, coloring of the glass increases to cause an increased loss in the glass layer, resulting in failure to achieve the object of improving the light-extraction efficiency. Accordingly, the content is desirably 15% or less, and more desirably 13% or less.

$WO_3$ is an optional component improving the refractive index and decreasing the glass transition temperature to decrease the firing temperature. However, excessive introduction thereof results in coloring of the glass to cause a decrease in the light-extraction efficiency. Accordingly, the content thereof is desirably 50% or less, and more desirably 45% or less.

$Bi_2O_3$ is a component improving the refractive index, and can be introduced into the glass in relatively large amounts while keeping stability of the glass. However, excessive introduction thereof poses a problem that the glass is colored to decrease the transmittance. Accordingly, the content thereof is desirably 30% or less, and more desirably 25% or less.

In order to increase the refractive index more than the desired value, one or more components of $Nb_2O_5$, $TiO_2$, $WO_3$ and $Bi_2O_3$ described above should be contained. Specifically, the total amount of $(Nb_2O_5+TiO_2+WO_3+Bi_2O_3)$ is desirably 20% or more, and more desirably 25% or more. On the other hand, when the total amount of these components is too large, coloring occurs, or devitrification excessively increases. Therefore, the total amount is desirably 60% or less, and more desirably 55% or less.

$Ta_2O_5$ is an optional component improving the refractive index. However, when the amount added is too large, resistance to devitrification decreases. In addition, $Ta_2O_5$ is expensive. Accordingly, the content thereof is desirably 10% or less, and more desirably 5% or less.

The alkali metal oxides ($R_2O$) such as $Li_2O$, $Na_2O$ and $K_2O$ have an effect of improving meltability to decrease the glass transition temperature and an effect of enhancing affinity with the glass substrate to increase adhesion. For this reason, it is desirable to include one, or two or more kinds of the alkali metal oxides. These are included desirably in an amount of 5% or more, and more desirably in an amount of 10% or more, as the total amount of $Li_2O+Na_2O+K_2O$. However, when they are contained in excessive amounts, stability of the glass is impaired. In addition, since all of the alkali metal oxides are components decreasing the refractive index, the refractive index of the glass decreases, resulting in failure of the desired improvement of the light-extraction efficiency. Accordingly, the total content is desirably 40% or less, and more desirably 35% or less.

$Li_2O$ is a component for decreasing the glass transition temperature and improving solubility. However, when the content is too much, devitrification excessively increases to result in failure to obtain homogeneous glass. Further, the thermal expansion coefficient excessively increases to increase the difference in the expansion coefficient from the substrate. Also, the refractive index also decreases to result in failure to achieve a desired improvement of the light-extraction efficiency. Accordingly, the content is desirably 20% or less, and more desirably 15% or less.

Both of $Na_2O$ and $K_2O$ are optional components improving meltability. However, excessive inclusion thereof causes a decrease in the refractive index, resulting in failure to achieve the desired light-extraction efficiency. Accordingly, the contents are each desirably 20% or less, and more desirably 15% or less.

ZnO is a component improving the refractive index and decreasing the glass transition temperature. However, when it is excessively added, devitrification of the glass increases to result in failure to obtain the homogeneous glass. Accordingly, the content is desirably 20% or less, and more desirably 18% or less.

BaO is a component improving the refractive index and solubility. However, when it is excessively added, stability of the glass is impaired. Accordingly, the content thereof is desirably 20% or less, and more desirably 18% or less.

MgO, CaO and SrO are optional components improving solubility, and decreasing the refractive index at the same time. Accordingly, the contents are each desirably 10% or less, and more desirably 8% or less.

In order to obtain the high refractive index and stable glass, the total amount of the above-mentioned components is desirably 90% or more, more desirably 93% or more, and still more desirably 95% or more.

In addition to the components described above, a refining agent, a vitrification enhancing component, a refractive index adjusting component, a wavelength converting component or the like may be added in small amounts within the range not impairing necessary glass characteristics. Specifically, as the refining agents, $Sb_2O_3$ and $SnO_2$ may be mentioned, as the vitrification enhancing components, $GeO_2$, $Ga_2O_3$ and $In_2O_3$ may be mentioned, as the refractive index adjusting components, $ZrO_2$, $Y_2O_3$, $La_2O_3$, $Gd_2O_3$ and $Yb_2O_3$ may be mentioned, and as the wavelength converting components, rare-earth components such as $CeO_2$, $Eu_2O_3$ and $Er_2O_3$, and the like may be mentioned.

The glass layer containing $B_2O_3$ and $La_2O_3$ as essential components and one or more components of $Nb_2O_5$, $ZrO_2$, $Ta_2O_5$ and $WO_3$ is desirably a glass within the composition range of: 20 to 60% of $B_2O_3$, 0 to 20% of $SiO_2$, 0 to 20% of $Li_2O$, 0 to 10% of $Na_2O$, 0 to 10% of $K_2O$, 5 to 50% of ZnO, 5 to 25% of $La_2O_3$, 0 to 25% of $Gd_2O_3$, 0 to 20% of $Y_2O_3$, 0 to 20% of $Yb_2O_3$, provided that $La_2O_3+Gd_2O_3+Y_2O_3+Yb_2O_3$ is from 5 to 30%, 0 to 15% of $ZrO_2$, 0 to 20% of $Ta_2O_5$, 0 to 20% of $Nb_2O_5$, 0 to 20% of $WO_3$, 0 to 20% of $Bi_2O_3$ and 0 to 20% of BaO, in terms of mol %.

Effects of the respective components are as follows in terms of mol %.

$B_2O_3$ is a network-forming oxide, and an essential component in this glass system.

When the content is too small, glass formation is not performed, or resistance to devitrification of the glass decreases. Accordingly, it is included desirably in an amount of 20% or more, and more desirably in an amount of 25% or more. On the other hand, when the content is too high, the refractive index decreases, and further, resistance decreases. Accordingly, the content is restricted to 60% or less, and more desirably, it is 55% or less.

$SiO_2$ is a component improving stability of the glass when added to the glass of this system. However, when the amount introduced is too large, the refractive index decreases, and the glass transition temperature increases. Therefore, the content is desirably 20% or less, and more desirably 18% or less.

$Li_2O$ is a component decreasing the glass transition temperature. However, when the amount introduced is too large, resistance to devitrification of the glass decreases. Therefore, the content is desirably 20% or less, and more desirably 18% or less.

$Na_2O$ and $K_2O$ improve solubility. However, introduction thereof causes a decrease in resistance to devitrification and a decrease in the refractive index. Accordingly, each content is desirably 10% or less, and more desirably 8% or less.

ZnO is an essential component improving the refractive index of the glass and decreasing the glass transition temperature. Therefore, the amount introduced is desirably 5% or more, and more desirably 7% or more. On the other hand, when the amount added is too large, resistance to devitrification decreases to result in failure to obtain the homogeneous glass. Accordingly, it is desirably 50% or less, and more desirably 45% or less.

$La_2O_3$ is an essential component achieving a high refractive index and improving weather resistance when introduced into the $B_2O_3$ system glass. Therefore, the amount introduced is desirably 5% or more, and more desirably 7% or more. On the other hand, when the amount introduced is too large, the glass transition temperature increases, or resistance to devitrification of the glass decreases, resulting in failure to obtain the homogeneous glass. Accordingly, the content is desirably 25% or less, and more desirably 22% or less.

$Gd_2O_3$ is a component achieving a high refractive index, improving weather resistance when introduced into the $B_2O_3$ system glass and improving stability of the glass by coexistence with $La_2O_3$. However, when the amount introduced is too large, stability of the glass decreases. Accordingly, the content thereof is desirably 25% or less, and more desirably 22% or less.

$Y_2O_3$ and $Yb_2O_3$ are components achieving a high refractive index, improving weather resistance when introduced into the $B_2O_3$ system glass and improving stability of the glass by coexistence with $La_2O_3$. However, when the amount introduced is too large, stability of the glass decreases. Accordingly, the contents are each desirably 20% or less, and more desirably 18% or less.

The rare-earth oxides such as $La_2O_3$, $Gd_2O_3$, $Y_2O_3$ and $Yb_2O_3$ are components essential for achieving a high refractive index and improving weather resistance of the glass. Accordingly, the total amount of these components, $La_2O_3+Gd_2O_3+Y_2O_3+Yb_2O_3$, is desirably 5% or more, and more desirably 8% or more. However, when the amount introduced is too large, resistance to devitrification of the glass decreases to result in failure to obtain the homogeneous glass. Accordingly, the amount introduced is desirably 30% or less, and more desirably 25% or less.

$ZrO_2$ is a component for improving the refractive index. However, when the content is too high, resistance to devitrification decreases, or the liquidus temperature is excessively increased. Accordingly, the content is desirably 15% or less, and more desirably 10% or less.

$Ta_2O_5$ is a component for improving the refractive index. However, when the content is too high, resistance to devitrification decreases, or the liquidus temperature is excessively increased. Accordingly, the content is desirably 20% or less, and more desirably 15% or less.

$Nb_2O_5$ is a component for improving the refractive index. However, when the content is too high, resistance to devitrification decreases, or the liquidus temperature is excessively increased. Accordingly, the content is desirably 20% or less, and more desirably 15% or less.

$WO_3$ is a component for improving the refractive index. However, when the content is too high, resistance to devitrification decreases, or the liquidus temperature is excessively increased. Accordingly, the content is desirably 20% or less, and more desirably 15% or less.

$Bi_2O_3$ is a component for improving the refractive index. However, when the content is too high, resistance to devitrification decreases, or coloring occurs in the glass to cause a decrease in the refractive index, resulting in a decrease in extraction efficiency. Accordingly, the content is desirably 20% or less, and more desirably 15% or less.

BaO is a component for improving the refractive index. However, when the content is too high, resistance to devitrification decreases. Accordingly, the content is desirably 20% or less, and more desirably 15% or less.

In order to retain the high refractive index and the stability (humidity resistance), the total amount of the above-mentioned components is desirably 90% or more, and more desirably 95% or more. Even a component other than the above-mentioned components may be added for the purposes of refining or an improvement of solubility, within the range not impairing the effects of the invention. Such components include, for example, $Sb_2O_3$, $SnO_2$, MgO, CaO, SrO, $GeO_2$, $Ga_2O_3$, $In_2O_3$ and fluorine.

The glass layer containing $SiO_2$ as an essential component and one or more components of $Nb_2O_5$, $TiO_2$ and $Bi_2O_3$ is desirably a glass within the composition range of: 20 to 50% of $SiO_2$, 0 to 20 of $B_2O_3$, 1 to 20% of $Nb_2O_5$, 1 to 20% of $TiO_2$, 0 to 15% of $Bi_2O_3$, 0 to 15% of $ZrO_2$, provided that $Nb_2O_5+TiO_2+Bi_2O_3+ZrO_2$ is from 5 to 40%, 0 to 40% of $Li_2O$, 0 to 30% of $Na_2O$, 0 to 30% of $K_2O$, provided that $Li_2O+Na_2O+K_2O$ is from 1 to 40%, 0 to 20% of MgO, 0 to 20% of CaO, 0 to 20% of SrO, 0 to 20% of BaO and 0 to 20% of ZnO, in terms of mol %.

$SiO_2$ is an essential component acting as a network former for forming the glass. When the content thereof is too small, no glass is formed. Accordingly, the content is desirably 20% or more, and more desirably 22% or more.

$B_2O_3$ is added in relatively small amounts with $SiO_2$, thereby assisting glass formation and decreasing devitrification. However, when the content is too high, the refractive index decreases. Accordingly, the content thereof is desirably 20% or less, and more desirably 18% or less.

$Nb_2O_5$ is an essential component for improving the refractive index, and the content thereof is desirably 1% or more, and more desirably 3% or more. However, excessive addition thereof causes a decrease in resistance to devitrification of the glass to result in failure to obtain the homogeneous glass. Accordingly, the content thereof is desirably 20% or less, and more desirably 18% or less.

$TiO_2$ is an essential component for improving the refractive index, and the content thereof is desirably 1% or more, and more desirably 3% or more. However, excessive addition thereof causes a decrease in resistance to devitrification of the glass to result in failure to obtain the homogeneous glass and causes coloring to increase a loss due to absorption at the time when light propagates in the glass layer. Therefore, the content thereof is desirably 20% or less, and more desirably 18% or less.

$Bi_2O_3$ is a component for improving the refractive index. However, excessive addition thereof causes a decrease in resistance to devitrification of the glass to result in failure to obtain the homogeneous glass and causes coloring to increase a loss due to absorption at the time when light propagates in the glass layer. Therefore, the content thereof is desirably 15% or less, and more desirably 12% or less.

$ZrO_2$ is a component improving the refractive index without deteriorating the degree of coloring. However, when the content is too high, resistance to devitrification of the glass decreases to result in failure to obtain the homogeneous glass. Therefore, the content is desirably 15% or less, and more desirably 10% or less.

In order to obtain the high refractive index glass, $Nb_2O_5+TiO_2+Bi_2O_3+ZrO_2$ is desirably 5% or more, and more desirably 8% or more. On the other hand, when this total amount is too large, resistance to devitrification of the glass decreases, or coloring occurs. Accordingly, the total amount is desirably 40% or less, and more desirably 38% or less.

$Li_2O$, $Na_2O$ and $K_2O$ are components improving solubility, decreasing the glass transition temperature and enhancing affinity with the glass substrate. Therefore, the total amount of these components, $Li_2O+Na_2O+K_2O$, is desirably 1% or more, and more desirably 3% or more. On the other hand, when the content of the alkali oxide component is too high, resistance to devitrification of the glass decreases to result in failure to obtain the homogeneous glass. Accordingly, the content thereof is desirably 40% or less, and more desirably 35% or less.

BaO is a component improving the refractive index and improving solubility at the same time. However, when it is excessively included, stability of the glass is impaired to result in failure to obtain the homogeneous glass. Accordingly, the content thereof is desirably 20% or less, and more desirably 15% or less.

MgO, CaO, SrO and ZnO are components improving solubility of the glass, and moderate addition thereof can decrease resistance to devitrification of the glass. However, when they are contained in excessive amounts, devitrification increases to result in failure to obtain the homogeneous glass. Accordingly, the contents thereof are each desirably 20% or less, and more desirably 15% or less.

In order to retain the high refractive index and the stability (humidity resistance), the total amount of the above-mentioned components is desirably 90% or more. Further, even a component other than the above-mentioned components may be added for the purposes of refining, an improvement of solubility and the like within the range not impairing the effects of the invention. Such components include, for example, $Sb_2O_3$, $SnO_2$, $GeO_2$, $Ga_2O_3$, $In_2O_3$, $WO_3$, $Ta_2O_5$, $La_2O_3$, $Gd_2O_3$, $Y_2O_3$ and $Yb_2O_3$.

The glass layer containing $Bi_2O_3$ as a main component and $SiO_2$, $B_2O_3$ and the like as glass forming auxiliaries is desirably a glass within the composition range of: 10 to 50% of $Bi_2O_3$, 1 to 40 of $B_2O_3$, 0 to 30% of $SiO_2$, provided that $B_2O_3+SiO_2$ is from 10 to 40%, 0 to 20% of $P_2O_5$, 0 to 15% of $Li_2O$, 0 to 15% of $Na_2O$, 0 to 15% of $K_2O$, 0 to 20% of $TiO_2$, 0 to 20% of $Nb_2O_5$, 0 to 20% of $TeO_2$, 0 to 10% of MgO, 0 to 10% of CaO, 0 to 10% of SrO, 0 to 10% of BaO, 0 to 10% of $GeO_2$ and 0 to 10% of $Ga_2O_3$, in terms of mol %.

Effects of the respective components are as follows in terms of mol %.

$Bi_2O_3$ is an essential component achieving a high refractive index and stably forming the glass even when introduced in large amounts. Therefore, the content thereof is desirably 10% or more, and more desirably 15% or more. On the other hand, excessive addition thereof causes coloring in the glass to absorb light which is supposed to be transmitted, resulting in a decrease in extraction efficiency. In addition, devitrification increases to result in failure to obtain the homogeneous glass. Accordingly, the content thereof is desirably 50% or less, and more desirably 45% or less.

$B_2O_3$ is an essential component acting as a network former in the glass containing a large amount of $Bi_2O_3$ to assist glass formation, and the content thereof is desirably 1% or more, and more desirably 3% or more. However, when the amount added is too large, the refractive index of the glass decreases. Accordingly, it is desirably 40% or less, and more desirably 38% or less.

$SiO_2$ is a component acting to assist $Bi_2O_3$ in glass formation as a network former. However, when the content is too high, the refractive index decreases. Accordingly, the content is desirably 30% or less, and more desirably 25% or less.

$B_2O_3$ and $SiO_2$ improve glass formation by a combination thereof, so that the total amount thereof is desirably 5% or more, and more desirably 10% or more. On the other hand, when the amount introduced is too large, the refractive index decreases. Accordingly, it is desirably 40% or less, and more desirably 38% or less.

$P_2O_5$ is a component assisting glass formation and inhibiting deterioration of the degree of coloring. However, when the content is too high, the refractive index decreases. Accordingly, the content is desirably 20% or less, and more desirably 18% or less.

$Li_2O$, $Na_2O$ and $K_2O$ are components for improving glass solubility and further decreasing the glass transition temperature. However, when they are contained in excessive amounts, devitrification increases to result in failure to obtain the homogeneous glass. Accordingly, the contents thereof are each desirably 15% or less, and more desirably 13% or less. Further, when the total amount of the above alkali oxide components, $Li_2O+Na_2O+K_2O$, is too large, the refractive index decreases, and further, resistance to devitrification decreases. Accordingly, the total amount is desirably 30% or less, and more desirably 25% or less.

$TiO_2$ is a component improving the refractive index. However, when the content is too high, coloring occurs, or resistance to devitrification decreases, resulting in failure to obtain the homogeneous glass. Accordingly, the content is desirably 20% or less, and more desirably 18% or less.

$Nb_2O_5$ is a component improving the refractive index. However, when the amount introduced is too large, resistance to devitrification of the glass decreases to result in failure to obtain the stable glass. Accordingly, the content is desirably 20% or less, and more desirably 18% or less.

$TeO_2$ is a component improving the refractive index without deteriorating the degree of coloring. However, excessive introduction thereof results in a decrease in resistance to devitrification, which causes coloring at the time when fired after fritting. Accordingly, the content thereof is desirably 20% or less, and more desirably 15% or less.

$GeO_2$ is a component improving stability of the glass while keeping the refractive index relatively high. However, since $GeO_2$ is extremely expensive, the content is desirably 10% or less, and more desirably 8% or less. It is still more desirable not to contain it.

$Ge_2O_3$ is a component improving stability of the glass while keeping the refractive index relatively high. However, since $Ge_2O_3$ is extremely expensive, the content is desirably 10% or less, and more desirably 8% or less. It is still more desirable not to contain it.

In order to obtain sufficient scattering characteristics, the total amount of the above-mentioned components is desirably 90% or more, and more desirably 95% or more. Even a component other than the above-mentioned components may be added for the purposes of refining, an improvement of solubility, adjustment of the refractive index, and the like within the range not impairing the effects of the invention. Such components include, for example, $Sb_2O_3$, $SnO_2$, $In_2O_3$, $ZrO_2$, $Ta_2O_5$, $WO_3$, $La_2O_3$, $Gd_2O_3$, $Y_2O_3$, $Yb_2O_3$ and $Al_2O_3$.

2. Resin

The resin supports the glass powder and the filler in the coated film after screen printing. As a specific example, ethyl cellulose, nitrocellulose, an acrylic resin, vinyl acetate, a butyral resin, a melamine resin, an alkyd resin, a rosin resin or the like is used.

3. Solvent

The solvent dissolves the resin and adjusts the viscosity necessary for printing. Further, it does not dry during printing, and rapidly dries in a drying process. A desirable solvent is one having a boiling point of 200° C. to 230° C. For adjustment of the viscosity, the solid content ratio and the drying rate, a mixture of certain solvents is used. Specific examples include ether type solvents (butyl carbitol (BC), butyl carbitol acetate (BCA), diethylene glycol di-n-butyl ether, dipropylene glycol dibutyl ether, tripropylene glycol butyl ether and butyl cellosolve acetate), alcohol type solvents (α-terpineol, pine oil and Dowanol), ester type solvents (2,2,4-trimethyl-1,3-pentanediol monoisobutyrate) and phthalic acid ester type solvents (DBP (dibutyl phthalate), DMP (dimethyl phthalate) and DOP (dioctyl phthalate)), in terms of drying suitability of the paste during the screen printing. Mainly used are α-terpineol and 2,2,4-trimethyl-1,3-pentanediol monoisobutyrate.

4. Others

A surfactant may be used for adjusting viscosity and promoting dispersion of the glass powder. A silane coupling agent may be used for glass powder surface modification.

(Preparation Method of Glass Paste)

(1) Glass Paste

A glass powder and a vehicle are prepared. The vehicle herein refers to a mixture of a resin, a solvent and a surfactant. Specifically, the vehicle is obtained by putting the resin, the surfactant and the like in the solvent heating at 50° C. to 80° C., and then, allowing the resulting mixture to stand for about 4 hours to about 12 hours, followed by filtering.

Then, the glass powder and the vehicle are mixed by a planetary mixer, and then, uniformly dispersed by a three-roll mill. Thereafter, the resulting mixture is kneaded by a kneader for the purpose of viscosity adjustment. Usually, the vehicle is used in an amount of 20 to 30 wt % based on 70 to 80 wt % of the glass powder.

(2) Printing

The glass paste prepared in (1) is printed by using a screen printer. The film thickness of a glass paste film formed can be controlled by the mesh roughness of a screen plate, the thickness of an emulsion, the pressing force in printing, the squeegee pressing amount and the like. After printing, drying is performed.

(3) Firing

The firing includes debinderizing treatment for decomposing the resin in the glass paste and allowing it to disappear and firing treatment for sintering and softening the glass powder. The debinderizing temperature is from 350° C. to 400° C. for ethyl cellulose, and from 200° C. to 300° C. for nitrocellulose. Heating is carried out in the atmosphere for 30 minute to 1 hour. Then, the temperature is raised to sinter and soften the glass. The firing temperature is usually from the softening temperature to a temperature higher 20° C. than the softening temperature, and the shape and size of pores remaining in the inside vary depending on the firing temperature. Then, cooling is carried out to form a glass layer on the substrate. Although the thickness of the film obtained is from 5 μm to 30 μm, a thicker glass layer can be formed by lamination during printing.

A film is formed on a PET film or the like by using a doctor blade printing method, a die coat printing method or the like, and dried, thereby forming a green sheet. Then, the green sheet is heat pressed on the substrate, and the glass layer is obtained through a similar firing procedure. The thickness of the glass layer obtained in this method is from 50 μm to 400 μm. However, it is possible to form a thicker glass layer by using the laminated green sheets.

In order to obtain characteristics of the glass layer as the scattering layer, optical simulations are performed to examine influences exerted on the extraction efficiency of each parameter. A computer software used is a software "SPEOS" (trade name) manufactured by OPTIS Corporation. This software is software for tracing light rays, and at the same time, it is possible to apply a theoretical formula of Mie scattering to the glass layer. Herein, the film thickness and the refractive index of the glass scattering layer are respectively set to 30 μm and 2.0. The thickness of the organic layer actually used as a layer having a light-emitting function, such as a charge-injection-transport layer or a light-emitting layer, is actually from about 0.1 μm to about 0.3 μm in total. However, in tracing light rays, the angle of the rays does not change even when the thickness is changed. Accordingly, the minimum thickness allowed in the software was taken as 1 μm. For a similar reason, the total thickness of the glass substrate and the glass layer was taken as 100 μm.

Further, for simplicity, calculation was made by dividing the organic layer and the translucent electrode into the three of the charge-injection layer and the light-emitting layer, a hole-injection-transport layer, and the translucent electrode. In the calculation, the refractive indexes of these are assumed to be the same. However, the refractive indexes of the organic layer and the translucent electrode are about equivalent values, hence the calculated results are not largely changed; therefore, the refractive index is set to 1.9 in any case.

Considered strictly, a waveguide mode caused by interference is created since the organic layer is thin. However, the results are not largely changed, even when geometric-optically treated. Therefore, the effects of the invention are sufficiently estimated in this manner. In the organic layer, emitted light is assumed to be outgoing from a total of 6 faces without having directivity. Also, for simplification, the reflection rate of the cathode is assumed to be 100%. The calculation was made by taking the total light flux amount as 1,000 lm and the number of light rays as 100,000 rays or 1,000,000 rays. The light outgoing from the translucent substrate was captured by a light receiving surface mounted 10 μm above the translucent substrate, and the extraction efficiency was calculated from the illuminance thereof.

(Density of Scattering Material in Scattering Layer and Size of Scattering Material)

The content of the scattering material in the glass layer is desirably 1 vol % or more. Although the behavior varies depending on the size of the scattering material, when the content of the scattering material in the glass layer is 1 vol %, the light-extraction efficiency can be 40% or more. Further, when the content of the scattering material in the glass layer is 5 vol % or more, the light-extraction efficiency can be 65% or more, and thus is desirable. Furthermore, when the content of the scattering material in the glass layer is 10 vol % or more, the light-extraction efficiency can be improved to 70% or more, and thus is more desirable. In addition, when the content of the scattering material in the glass layer is approximately 15 vol %, the light-extraction efficiency can be improved to 80% or more, and thus is particularly desirable. Also, in view of mass production of the glass layers, the content is desirably from 10 vol % to 15 vol % at which production variations do not easily exert influences.

When the size of the scattering material is 1 μm, the light-extraction efficiency can be 70% or more, even when the content of the scattering material is within the range of 1 vol % to 20 vol %. In particular, when the content of the scattering material is within the range of 2 vol % to 15 vol %, the light-extraction efficiency can be 80% or more. Further, when the size of the scattering material is 2 μm, the light-extraction efficiency can be 65% or more, even when the content of the scattering material is within the range of 1 vol % to 20 vol %. In particular, when the content of the scattering material is 5 vol % or more, the light-extraction efficiency can be 80% or more. Furthermore, when the size of the scattering material is 3 μm, the light-extraction efficiency can be 60% or more, even when the content of the scattering material is within the range of 1 vol % to 20 vol %. In particular, when the content of the scattering material is 5 vol % or more, the light-extraction efficiency can be 80% or more. In addition, when the size of the scattering material is 5 μm, the light-extraction efficiency can be 50% or more, even when the content of the scattering material is within the range of 1 vol % to 20 vol %. In particular, when the content of the scattering material is 10 vol % or more, the light-extraction efficiency can be 80% or more. Further, when the size of the scattering material is 7 μm, the light-extraction efficiency can be 45% or more, even when the content of the scattering material is within the range of 1 vol % to 20 vol %. In particular, when the content of the scattering material is 10 vol % or more, the light-extraction efficiency can be 80% or more. Furthermore, when the size of the scattering material is 10 μm, the light-extraction efficiency can be 40% or more, even when the content of the scattering material is within the range of 1 vol % to 20 vol %. In particular, when the content of the scattering material is 15 vol % or more, the light-extraction efficiency can be 80% or more. The above shows that when the size of the scattering material is large, the light-extraction efficiency is improved with an increase in the content. On the other hand, it is seen that when the size of the scattering material is small, the light-extraction efficiency is improved, even when the content is small.

(Refractive Index of Scattering Material)

The relationship between the light-extraction efficiency (%) and the refractive index of a scattering material was found by calculation. In the following, for simplicity, calculation was made by dividing the organic layer and the translucent electrode into three parts, the electron-injection-transport layer and the light-emitting layer, the hole-injection-transport layer, and the translucent electrode. Here, the calculation was made by dividing the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the glass layer (thickness: 30 μm, the refractive index of the base material: 2.0, the size of the scattering material: 2 μm, the number of pieces of the scattering material: about 36,000,000, the content of the scattering material: 15 vol %), the glass substrate (thickness: 100 μm, refractive index: 1.54) and the light flux 1,000 lm into 100,000 rays (wavelength: 550 nm). As a result, when the difference between refractive index (2.0) of the base material and the refractive index of the scattering material is 0.2 or more (the refractive index of the scattering material is 1.8 or less), the light-extraction efficiency can be 80% or more, and thus is particularly desirable. Also, even when the difference between refractive index of the base material and the refractive index of the scattering material is 0.1 (the refractive index of the scattering material is 1.9), the light-extraction efficiency can be 65% or more.

(Thickness of Glass Layer)

In the same constitution as above, Δn of the glass layer was taken as 1.0. In this case, when the content of the scattering material in the glass layer is 1 vol % or more, the light-extraction efficiency can be 55% or more, even when the thickness of the glass layer is about 15 μm, and thus is desirable. Further, when the content of the scattering material in the glass layer is from 5 vol % to 15 vol %, the light-extraction efficiency can be 80% or more, even when the thickness of the glass layer is 15 μm or less, or 60 μm or more, and thus is particularly desirable.

(Number of Pieces of Scattering Material)

In the same constitution as above, Δn of the glass layer was taken as 1.0. When the number of pieces of the scattering material per 1 $mm^2$ of the glass layer is $1 \times 10^4$ or more, the light-extraction efficiency can be 55% or more, and thus is desirable. Further, when the number of pieces of the scattering material per 1 $mm^2$ of the glass layer is $2.5 \times 10^5$ or more, the light-extraction efficiency can be 75% or more, and thus is more desirable. Furthermore, when the number of pieces of the scattering material per 1 $mm^2$ of the glass layer is from $5 \times 10^5$ to $2 \times 10^6$, the light-extraction efficiency can be 80% or more, and thus is particularly desirable.

When the refractive index of the translucent electrode is larger than the refractive index of the glass layer, total reflection occurs on a surface of the glass layer to decrease the amount of light entering the glass layer. Accordingly, the light-extraction efficiency decreases. Therefore, it is desirable that the refractive index of the glass layer of the invention is equivalent to or higher than the refractive index of the translucent electrode.

(Measuring Methods of Refractive Index of Glass Layer)

The refractive index of the glass layer can be measured by the following two methods. One is a method of analyzing the composition of the glass layer, thereafter preparing a glass having the same composition, and evaluating the refractive index by a prism method. The other is a method of polishing the glass layer as thin as 1 to 2 and performing ellipsometry measurement in a region of about 10 μmϕ having no pores to evaluate the refractive index. In addition, in the invention, it is assumed that the refractive index is evaluated by the prism method.

(Surface Roughness of Glass Layer)

The glass layer has a surface on which the translucent electrode is provided. As described above, the glass layer of the invention contains the scattering material. As described above, when the size of the scattering material is large, even the smaller content thereof can improve the light-extraction efficiency. However, according to experiments of the inventors, there is a tendency that the larger the size is, the larger the arithmetic average roughness (Ra) of the main surface of the glass layer becomes, when projected from the main surface of the glass layer. As described above, the translucent electrode is provided on the main surface of the scattering layer. Accordingly, there is a problem that the larger arithmetic average roughness (Ra) of the main surface of the glass layer causes a short circuit to easily occur, resulting in no light emission of the organic LED element.

<Translucent Electrode>

It is desirable that the translucent electrode (anode) 103 has a translucency of 80% or more to extract the light generated in the organic layer 110 to the outside. Further, in order to inject many holes, a high work function is required for the translucent electrode. Specifically, a material such as ITO, $SnO_2$, ZnO, IZO (indium zinc oxide), AZO (ZnO—$Al_2O_3$: a zinc oxide doped with aluminum), GZO (ZnO—$Ga_2O_3$: a zinc oxide doped with gallium), Nb-doped $TiO_2$ or Ta-doped $TiO_2$ is used. The thickness of the translucent electrode 103 is desirably 100 nm or more. Also, the refractive index of the translucent electrode 103 is from 1.9 to 2.2. Here, if ITO is described as an example, an increase in carrier concentration can decrease the refractive index of ITO. Commercially available ITO contains 10 wt % of $SnO_2$ as a standard. The refractive index of ITO can be decreased by increasing the Sn concentration higher than this. However, although the carrier concentration is increased by an increase in the Sn concentration, the mobility and transmittance are decreased. Therefore, it is necessary to determine the Sn amount to balance the mobility and the transmittance.

Furthermore, needless to say, the translucent electrode may be used as the cathode.

<Organic Layer (Layer Having Light-Emitting Function)>

The organic layer 110 is a layer having a light-emitting function and includes a hole-injection layer 111, hole-transport layer 112, a light-emitting layer 113, an electron-transport layer 114 and an electron-injection layer 115. The refractive index of the organic layer 110 is from 1.7 to 1.8. For these hole-injection layer, hole-transport layer, light-emitting layer, electron-transport layer, and the electron-injection layer, materials and constitutions used for the usual organic LED element may be used. In addition, various known applications such as not providing a portion of layer, making a portion of layer to be a double layer, adding another layer or the like may be adopted.

<Reflective Electrode>

As the reflective electrode (cathode) 120, a metal having a small work function or an alloy thereof may be used. Specifically, examples of the cathode 120 include an alkali metal, an alkaline earth metal or a metal of group 3 in the periodic table. Among these, aluminum (Al), magnesium (Mg), an alloy thereof or the like is desirably used since these are materials being inexpensive and excellent in chemical stability. Further, a co-vapor-deposited film of Al and MgAg, a laminated electrode in which Al is vapor-deposited on a thin vapor-deposited film of LiF or $Li_2O$, or the like may be used. Further, in a polymer system, a laminate of calcium (Ca) or barium (Ba) and aluminum (Al), or the like may be used.

Also, needless to say, the reflective electrode may be used as the anode. Further, both the cathode and the anode can be used as the translucent electrode.

Furthermore, a constitution will be described in which sealing is performed by laminating an opposed substrate for sealing on the organic LED light-emitting element to improve the durability. First, a glass substrate different from the element substrate is prepared as the opposed substrate. This glass substrate is processed as necessary to form a desiccant housing portion for housing a desiccant. In order to form the desiccant housing portion, the glass substrate is coated with a resist, and a part of the substrate is exposed by exposure and development. This exposed portion is made thin by etching, thereby forming the desiccant housing portion.

The desiccant such as calcium oxide is disposed in this desiccant housing portion, and then the substrate having the organic LED element formed thereon and the opposed substrate are laminated and adhered to each other. For example, a seal material is applied to a surface of the opposed substrate on which the desiccant housing portion is provided, by using a dispenser. As the seal material, it is possible to use, for example, an epoxy-based UV-curable resin. Further, the seal material is applied to the whole periphery of a region facing to the organic LED element. The two substrates are aligned, allowed to face each other, and then, irradiated with UV light to cure the seal material, thereby adhering the substrates to each other. Thereafter, in order to further promote the curing of the seal material, for example, heat treatment is performed in a clean oven at 80° C. for 1 hour. As a result, a space between the substrates in which the organic LED element is present is isolated from the outside of the substrates by the seal material and the pair of substrates. Deterioration of the organic LED element due to water and the like remaining in the sealed space or entering therein can be prevented by disposing the desiccant.

As necessary, unnecessary portions in the vicinity of the periphery of the substrates are cut and removed, and the translucent electrode and the reflective electrode are connected to a driving circuit. When both the anode and the cathode are used as the translucent electrode, the translucent electrode of both electrodes is connected to the driving circuit.

In the above-mentioned embodiments, descriptions have been made for the constitution in which the organic layer is sandwiched between the translucent electrode and the reflective electrode. However, a bifacial light emission type organic EL layer may be constituted by making both electrodes translucent.

Further, the translucent electrode-attached translucent substrate of the invention is effective to increase the efficiency of optical devices such as various light-emitting devices such as inorganic LED elements and liquid crystals and light-receiving devices such as light quantity sensors and solar pores, without being limited to the organic LED elements.

EXAMPLES

Example 1

As the glass substrate 101, a glass substrate "PD200" (trade name) manufactured by Asahi Glass Co., Ltd. was used. This glass has a strain point of 570° C. and a thermal expansion coefficient of $83 \times 10^{-7}$ (1/° C.). The auxiliary wiring pattern 200 shown in FIG. 1, the pattern having a paste film thickness of 10 μm, a line width of 200 μm, and a grid shape of 10 cm×10 cm and including silver as a main component is formed on the glass substrate 101 through the screen printing by using the silver paste, as shown in FIG. 2(*a*).

The glass layer 102 is a layer formed by firing a high refractive index glass frit paste. Here, as the glass layer 102, a glass having the composition shown in Table 1 is used. This glass has a glass transition temperature of 483° C., a deformation point of 528° C. and a thermal expansion coefficient of $83 \times 10^{-7}$ (1/° C.).

The refractive index nF of this glass at the F line (486.13 nm) is 2.03558, the refractive index nd at the d line (587.56 nm) is 1.99810, and the refractive index nC at the C line (656.27 nm) is 1.98344. The refractive index was measured with a refractometer (manufactured by Kalnew Optical Industrial Co., Ltd, trade name: KRP-2). The glass transition temperature (Tg) and the deformation point (At) were measured with a thermal analysis instrument (manufactured by Bruker, trade name: TD5000SA) by a thermal expansion method at a rate of temperature increase of 5° C./min.

TABLE 1

|  | Mass % | Mol % |
|---|---|---|
| $P_2O_5$ | 16.4 | 23.1 |
| $B_2O_3$ | 1.9 | 5.5 |
| $Li_2O$ | 1.7 | 11.6 |
| $Na_2O$ | 1.2 | 4.0 |
| $K_2O$ | 1.2 | 2.5 |
| $Bi_2O_3$ | 38.6 | 16.6 |
| $TiO_2$ | 3.5 | 8.7 |
| $Nb_2O_5$ | 23.3 | 17.6 |
| $WO_3$ | 12.1 | 10.4 |

The glass layer 102 was formed by the following procedure. A powder raw material was prepared so as to give the composition indicated by the ratio of Table 1. The powder raw material prepared was dry milled in a ball mill made of alumina for 12 hours to prepare a glass powder having an average particle size (d50, particle size at an integrated value of 50%, unit: μm) of 1 to 3 μm. Then, 75 g of the resulting glass powder was kneaded with 25 g of an organic vehicle (one in which about 10% by mass of ethyl cellulose was dissolved in α-terpineol and the like) to prepare a paste ink (glass paste).

This glass paste is uniformly printed on the glass substrate 101 to film thicknesses after firing of 15 μm, 30 μm, 60 μm and 120 μm, except for the portion where the through-hole H will be formed. The through-hole H has an oval shape, and is provided at an interval of 5 cm so that the long axis thereof (100 μm) is positioned in the longitudinal direction of the auxiliary wiring and the short axis thereof (50 μm) is positioned in the direction orthogonal to the long axis, in the portion adjacent to the auxiliary wiring. Also, the lateral surface of the through-hole has a shape widening toward upper direction. Next, after being dried at 150° C. for 30 minutes, this is returned to room temperature at once. Then, the temperature is raised to 450° C. within 45 minutes, and held at 450° C. for 10 hours. Thereafter, the temperature is raised to 550° C. within 12 minutes, and held at 550° C. for 30 minutes. Then, the temperature is lowered to room temperature within 3 hours, to form a glass layer on the glass substrate. For the glass layer having a film thickness of 120 μm, a surface thereof is polished to a film thickness of 60 μm. In the glass film formed in this way, many pores are included, which causes the occurrence of scattering. On the other hand, on the outermost surface of the glass layer, although waviness is observed, the local unevenness causing an interelectrode short circuit of the organic LED element, such as openings of the pores, is not observed. In this manner, as shown in FIG. 2(*b*), the substrate for the electronic device in which the auxiliary wiring pattern 200 is coated with the through-hole H-attached glass layer 102 is formed.

The angle of the slope of the glass layer caused by the waviness of the surface taken by excluding the vicinity of the through-hole H of the glass layer can be set to about a maximum of 27°. This angle is smaller than the taper angle (40 to 50°) of an edge portion of an opening insulating film used in a passive type organic LED panel. Therefore, it is considered that this angle does not disturb coverage of the organic layer, the metal layer and the like.

Further, herein, the glass particles are not classified in preparing the frit, whereby large particles are contained. It is considered that the waviness is formed since the large particle portions become the waviness and remain at the time of firing. Therefore, provided that other conditions are identical, it is considered that the waviness can be adjusted by making the size of the particles small and uniform to reduce the waviness and by making the size of the particles large to increase the waviness.

In addition, regarding the local roughness, the glass substrate not forming the auxiliary wiring pattern was measured. Regarding the local roughness, when the surface of the glass layer had not been polished, the arithmetic average roughness Ra of the surface of glass layer was 31.0 nm, and when the surface of the glass layer had been polished, the arithmetic average roughness Ra of the surface of the glass layer was 23.5 nm. No local protrusion was observed on any surface of these glass layers, and the measurement results of the of the non-polished surface of the glass layer showed an unevenness form similar to that of the measurement results of the mirror-polished surface of the glass layer. Conceivably, this is because the scattering body in the glass layer is pores and no pores are present in the surface. When the scattering material is mixed with the organic material (when a resin is used as the base material, and solid particles are used as the scattering material), the scattering material is exposed on the surface in some cases. Therefore, it is necessary to prevent the short circuit of the organic LED element by smoothing the roughness of the surface of the scattering material.

On the other hand, the smooth surface is formed in the polished one.

The total light transmittance and haze value of each glass substrate for the electronic device (glass layer-attached substrate) were measured. As a measurement device, a haze meter HGM-2 manufactured by Suga Test Instruments Co., Ltd was used. As a reference, an untreated plate of the above-mentioned glass substrate "PD200" was measured. The results measured are shown in Table 2.

TABLE 2

| Thickness of Scattering Layer (μm) | Total Light Transmittance (%) | Haze Value (%) |
|---|---|---|
| 15 | 97.9 | 66.3 |
| 30 | 85.1 | 72.5 |
| 60 | 83.1 | 76.1 |

As shown above, it is seen that scatterability increases with an increase in the film thickness of the glass layer (scattering layer) having the scatterability.

Next, among the substrates for the electronic device formed above, by using a substrate having a thickness of 30 μm, the organic LED element shown in FIG. 1 is produced. Also, herein, in order to evaluate the glass layer having the scatterability, experiments were performed at the glass layer firing temperature of 570° C. and 580° C. as well as 550° C. for the substrate for the electronic device having no auxiliary wiring pattern formed therein. First, The ITO film as the translucent electrode 103 is formed on the glass layer 102 with the scatterability and the glass substrate 101 on which the glass layer 102 is not formed, to a film thickness of 150 nm by sputtering. The sputtering is performed at room temperature. Ar is set to 99.5 SCCM, $O_2$ is set to 0.5 SCCM, the pressure is set to 0.47 Pa, and the input electric power is set to 2.35 W/cm². Furthermore, mask film formation is performed herein by using a metal mask. Subsequently, ultrasonic cleaning using pure water is performed, and thereafter, UV light is irradiated with an excimer UV generator to clean a surface thereof. Then, on the ITO film as the translucent electrode 103, α-NPD (N,N'-diphenyl-N,N'-bis(1-naphthyl)-1,1'-biphenyl-4,4''-diamine) is vapor deposited to 100 nm, $Alq_3$ (tris(8-hydroxyquinoline)aluminum) to 60 nm, LiF as an electrode to 0.5 nm, and Al as a reflective electrode to 80 nm, by using a vacuum vapor deposition apparatus. At this time, α-NPD and $Alq_3$ are formed to a circular pattern having a diameter of 12 mm by using a mask, and LiF and Al are formed to a pattern on the ITO pattern with the interposition of the above-mentioned organic layers, using a mask having a region of 2 mm square, thereby completing the organic LED element.

Then, a concave portion is formed on PD200 as an opposed substrate by sand blasting, and a photosensitive epoxy resin is applied for peripheral sealing to a bank around the concave portion. Next, the element substrate and the opposed substrate are placed in a glove box, and a desiccant containing CaO is attached to the concave portion of the opposed substrate. Then, the element substrate and the opposed substrate are adhered to each other, followed by irradiation with UV light to cure the resin for peripheral sealing. Herein, in the experiment, the organic LED element was also formed by using the substrate for the electronic device on which the auxiliary wiring pattern was not formed. The state of the occurrence of the interelectrode short circuit in each element is shown in Table 3. The self-healing as used herein indicates that a short-circuit portion is self-healed by allowing an overcurrent of 10 mA to flow through the element to self-heal a short-circuit portion by the Joule heat thereof

TABLE 3

| Firing Temperature | State of Interelectrode Short Circuit | Remarks |
| --- | --- | --- |
| 550° C. | Δ to x | A short circuit occurred at Ra of 52 nm. Self-healing was impossible. A short circuit occurred at Ra of 33 nm. Self-healing was possible. |
| 570° C. | ○ | No short circuit occurred. |
| 580° C. | ○ | No short circuit occurred. |

States in which the elements emit light were observed. In the element having no scattering glass layer, light emission from only a region of approximately 2 mm square formed by the intersection of the ITO pattern and the Al pattern was confirmed. However, in the element formed on the scattering glass layer, it was seen that the light was extracted not only from the above-mentioned region of approximately 2 mm square, but also from a peripheral glass layer-forming portion to the atmosphere.

Figure 9:
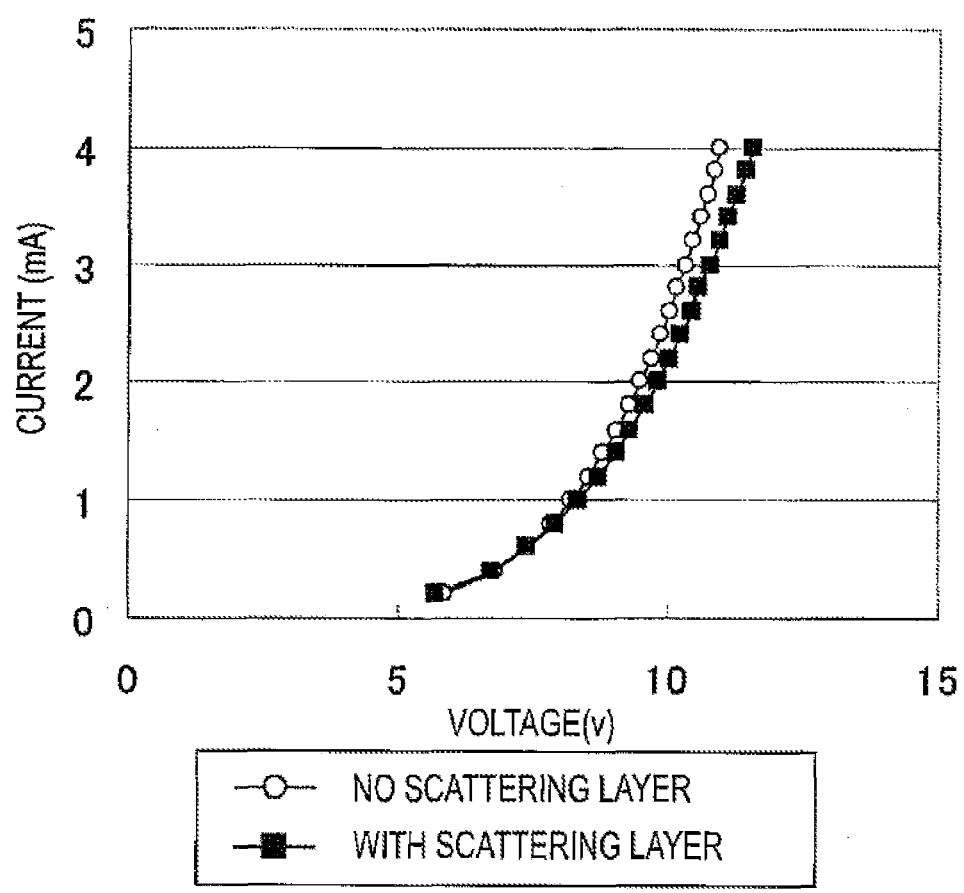
FIG. 9 is a graph showing the voltage-current characteristic of the organic LED elements formed by using the substrates for the electronic device of Example 1 of the invention and a comparative example.
Figure 10:
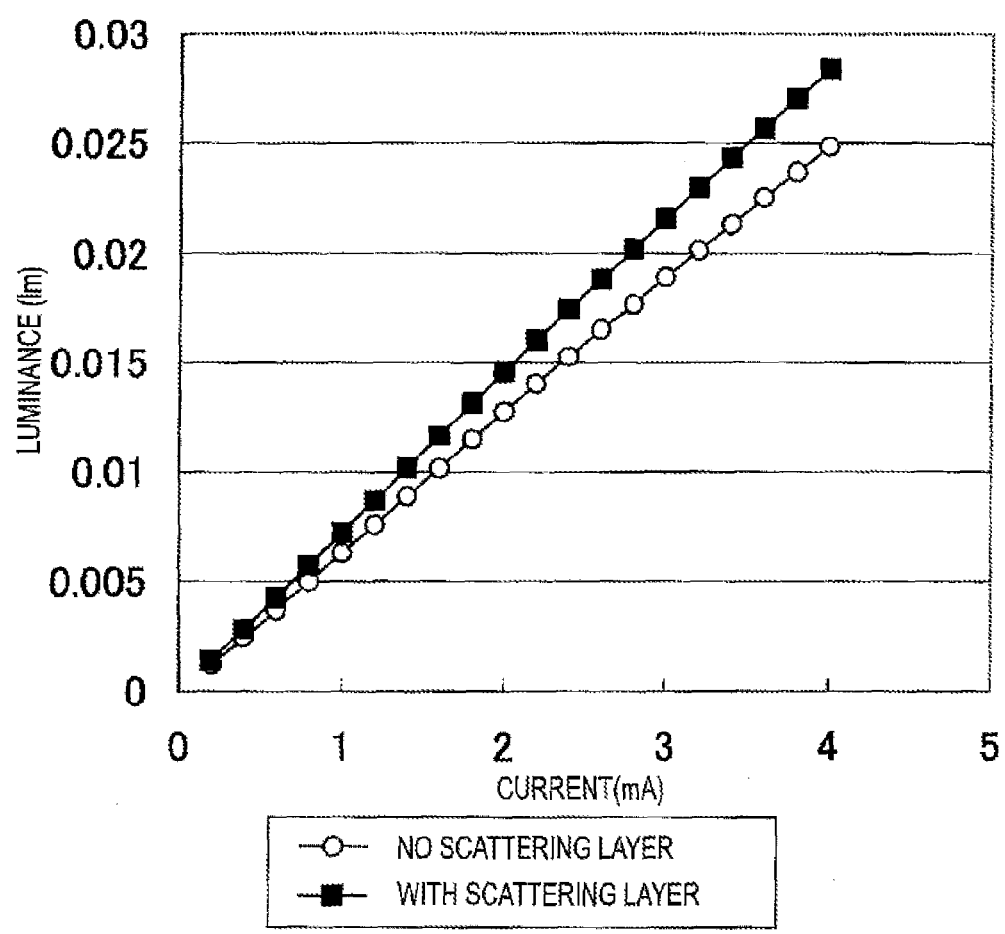
FIG. 10 is a view showing the current-luminance characteristic of the organic LED elements formed by using the substrates for the electronic device of Example 1 of the invention and a comparative example.

Thereafter, characteristics of the element in which the glass layer was fired at 570° C. were evaluated. For the measurement of the total light flux, an EL characteristic measuring apparatus C9920-12 manufactured by Hamamatsu Photonics K.K. was used. FIG. 9 shows the voltage-current characteristic of the element having the glass layer and the element having no glass layer. As shown in the graph, an approximately similar characteristic is obtained. This shows that a large leak current is not present even in the element formed on the glass layer. Next, FIG. 10 shows the current-luminance characteristic. As shown in the graph, the light flux amount is proportional to the current independently of the presence or absence of the scattering glass layer. In the case of having the scattering glass layer, the light flux amount increased 15%, compared to the case of having no scattering glass layer. This shows that since the refractive index of the glass layer is higher than the refractive index of ITO as the translucent electrode at the light-emitting wavelength (450 nm to 700 nm) of $Alq_3$, EL emitted light of $Alq_3$ is inhibited from being totally reflected at an interface between ITO and the scattering glass layer, resulting in efficient extraction of light to the atmosphere.

Next, the angular dependency of color was evaluated. For optical measurement, a multichannel spectroscope (trade name: C10027) manufactured by Hamamatsu Photonics K.K. was used. The measurement was made while rotating the element for the spectroscope, thereby measuring the angular dependency of light-emitting luminance and light-emitting color. For the definition of the angle, the angle between a normal line direction of the element and a direction extending from the element to the spectroscope was defined as the measurement angle θ [°]. Namely, a state in which the spectroscope is placed in front of the element becomes 0°.

Figure 11:
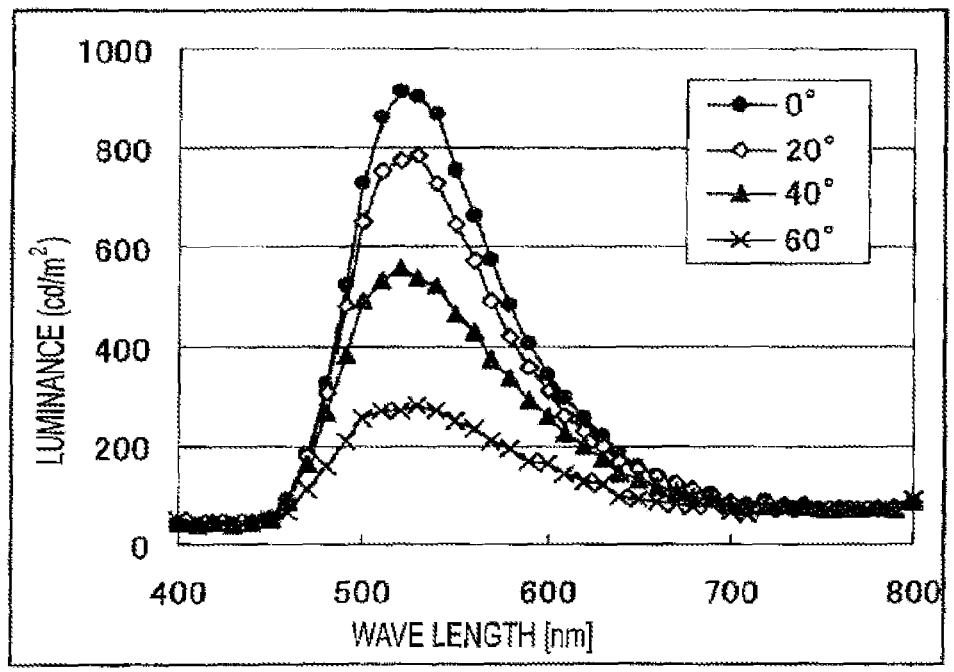
FIG. 11 is a graph showing spectral data of the angular dependency of light-emitting luminance and light-emitting color of an organic LED element of a comparative example.
Figure 12:
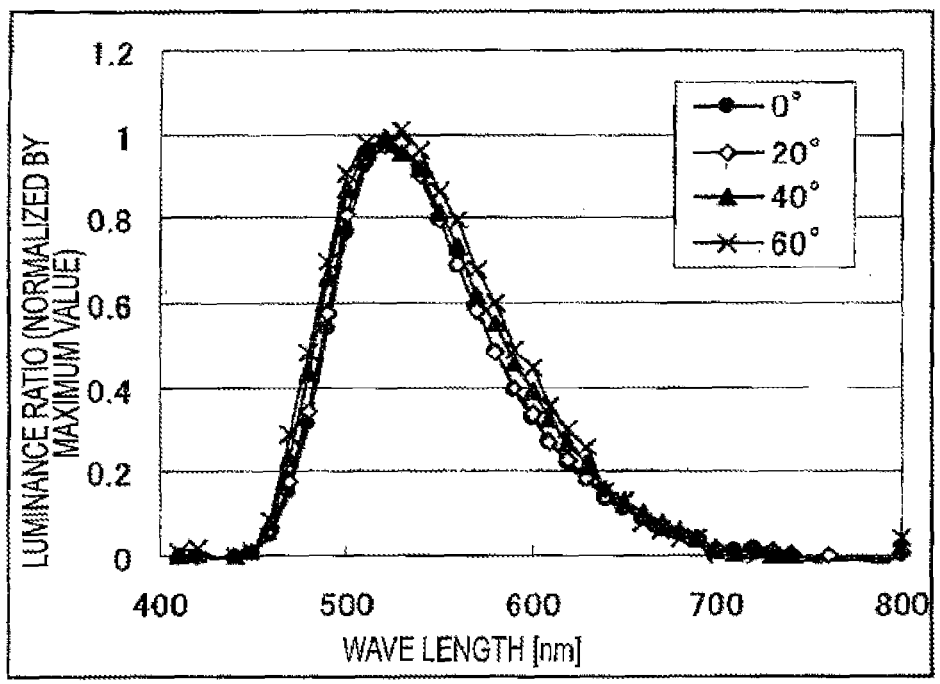
FIG. 12 is a graph showing spectral data of the angular dependency of light-emitting luminance and light-emitting color of an organic LED element of a comparative example.

The spectral data obtained are shown in FIGS. 11 to 14. FIG. 11 shows the measurement results of the organic LED element having no scattering glass layer. FIG. 12 shows spectral data further normalized, taking the luminance at a wavelength showing the maximum luminance at each measurement angle as 1. From FIG. 12, it is seen that deviations occur in the spectra depending on the measurement angle.

Figure 13:
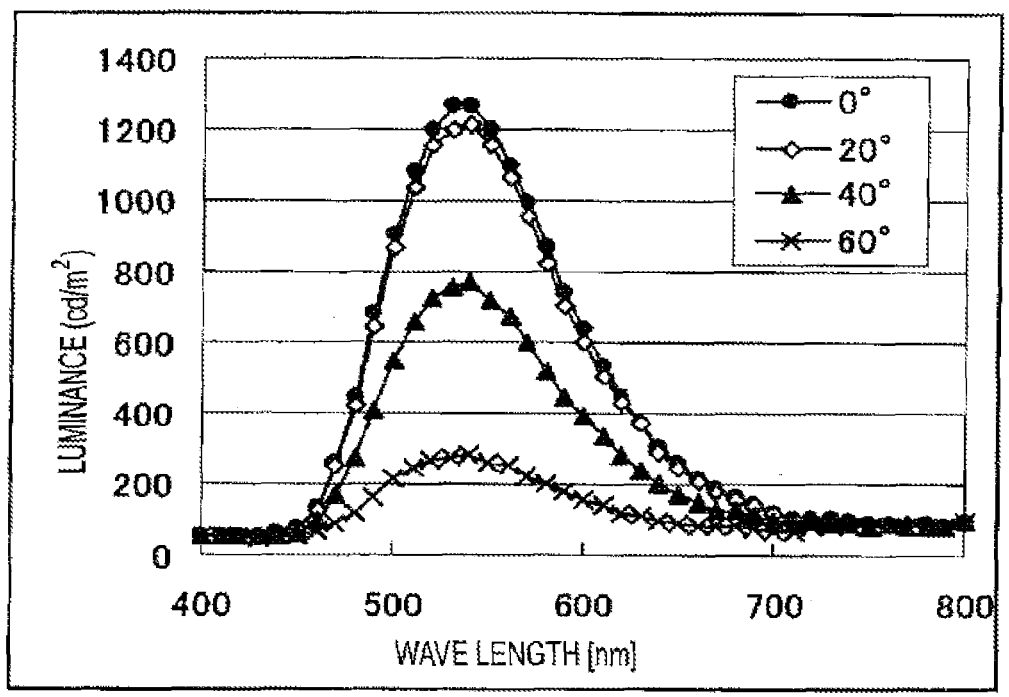
FIG. 13 is a graph showing spectral data of the angular dependency of light-emitting luminance and light-emitting color of an organic LED element of Example 1 of the invention.
Figure 14:
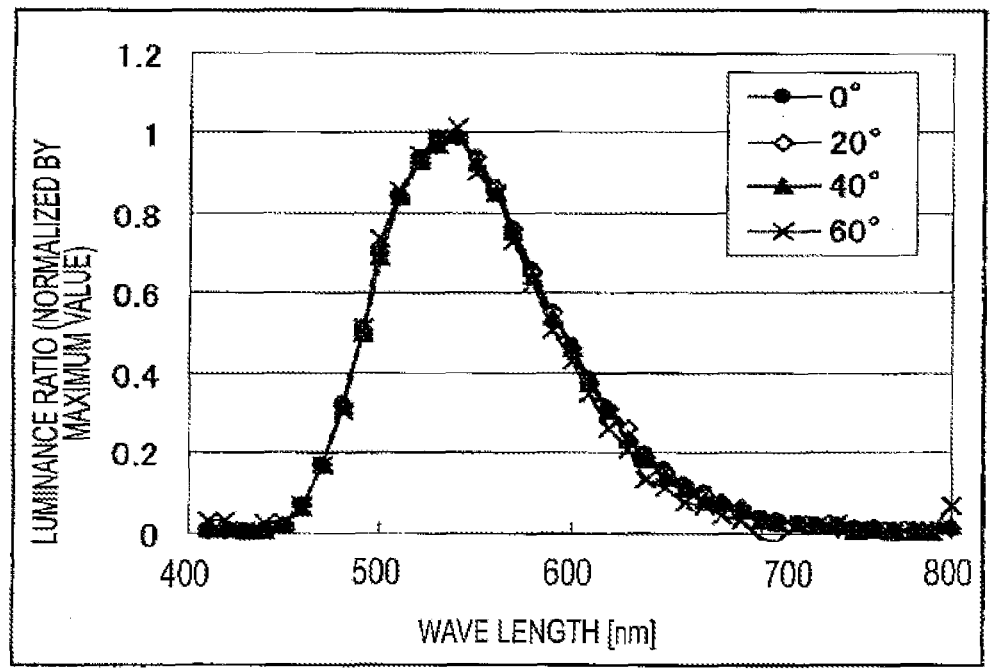
FIG. 14 is a graph showing spectral data of the angular dependency of light-emitting luminance and light-emitting color of an organic LED element of Example 1 of the invention.

Then, FIG. 13 shows the measurement results of the organic LED element having the scattering glass layer. FIG. 14 shows spectral data further normalized, taking the luminance at a wavelength showing the maximum luminance at each measurement angle as 1. From FIG. 14, it is seen that deviations almost do not occur in the spectra even when the measurement angle changes. Further, the results of conversion of the above-mentioned spectra to chromaticity coordinates are shown in Table 4 and FIG. 15.

TABLE 4

| Measurement | No Scattering Layer | | With Scattering Layer | |
| --- | --- | --- | --- | --- |
| Angle θ | x | y | x | y |
| 0° (Front) | 0.304 | 0.595 | 0.333 | 0.579 |
| 10° | 0.305 | 0.59 | 0.333 | 0.579 |
| 20° | 0.302 | 0.593 | 0.333 | 0.579 |
| 30° | 0.305 | 0.585 | 0.333 | 0.579 |
| 40° | 0.305 | 0.577 | 0.331 | 0.581 |
| 50° | 0.314 | 0.566 | 0.33 | 0.582 |
| 60° | 0.316 | 0.56 | 0.33 | 0.582 |

It is seen that the element having no scattering glass layer changes greatly in color depending on the measurement angle, whereas changes are small for the element having the scattering glass layer. The above reveals that a further effect of decreasing angle is that changes in color are obtained, in addition to the effect of improving the light-extraction efficiency which is the original object, by imparting the scattering glass layer to the element. The small angle changes in color result in a great advantage that the seeing angle is not limited, as the light-emitting element.

As known from the above-mentioned evaluation experiments, it has been proved that the simulations of the invention are correct.

Figure 15:
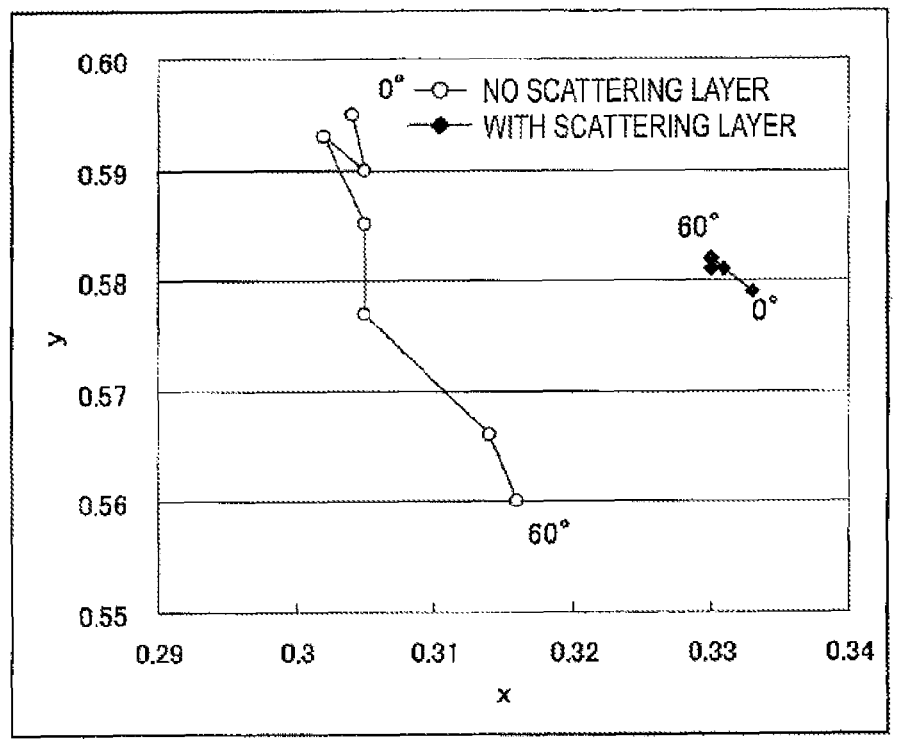
FIG. 15 is a graph showing the chromatic coordinates of the angular dependency of light-emitting luminance and light-emitting color of the organic LED element of Example 1 of the invention.
Figure 16:
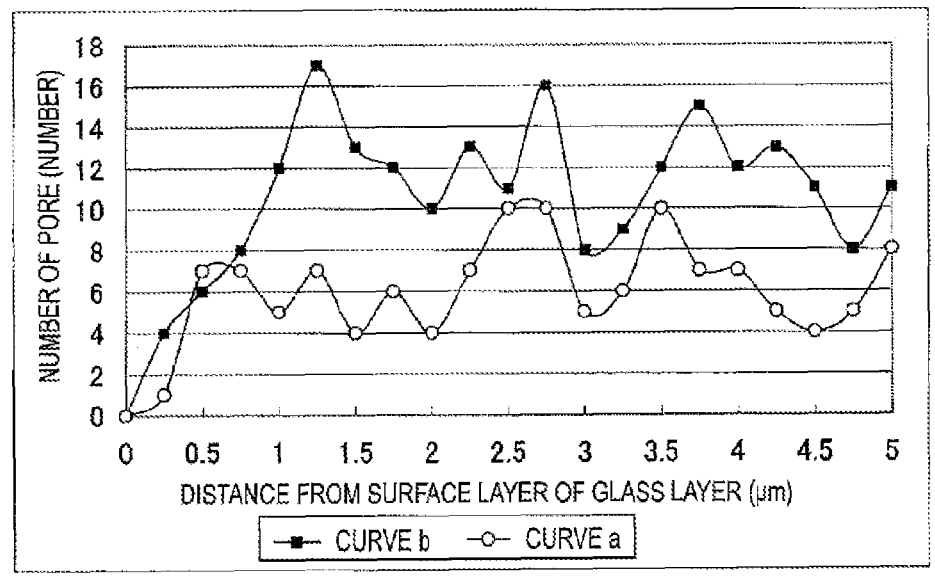
FIG. 16 is a graph showing the relationship between the depth and the number of pores in a glass layer of the organic LED element of Example 1 of the invention.

Furthermore, among the scattering glass layers used herein, cross sections of ones fired at 570° C. and 580° C. were polished, and SEM photographs were taken at a magnification of 10,000×. From the photographs, the relationship between the number of pores and distances from the surface of the glass layer to the pores was examined. The lateral length of the SEM photograph was 12.5 μm. Lines were drawn on the SEM photograph at intervals of 0.25 μm from the surface of the glass layer, and the number of pores found in a frame of 0.25 μm×12.5 μm was counted. Here, a pore existing over a plurality of frames was counted as existing in a lower frame. The results thereof are shown in FIG. 16. The X-axis indicates the distance from the surface of the glass layer herein. For example, a point at 0.5 μm shows the number of pores confirmed in a frame 0.25 μm to 0.5 μm apart measured from the surface of the glass layer. Further, X=0 shows the number of concave portions existing on the surface of the glass scattering layer, as shown in FIG. 14 or FIG. 15. As shown in the graph, it can be confirmed that the number of pores decreases with an approach to the surface from 0.5 μm from the surface, as shown by curve a, in the case of a firing temperature of 570° C., and from 1.25 μm from the surface, as shown by curve b, in the case of a firing temperature of 580° C. Further, in both cases, no concave portion was confirmed on the surface.

Further, from FIG. 16, it is apparent that the density $\rho_2$ of the scattering material at a distance x (x≦0.2 μm) from the surface of the glass layer and the density $\rho_1$ of the scattering material at a distance x=2 μm satisfy $\rho_1 > \rho_2$. Furthermore, FIG. 16 shows the results in the case where the firing temperature is 570° C. and 580° C. However, even when the firing temperature was somewhat varied, similar results could be obtained.

Moreover, from FIG. 16, it is also apparent that the density $\rho_2$ of the scattering material at a distance x (x≦0.2 μm) from the surface of the glass layer and the density $\rho_1$ of the scattering material at a distance x=5 μm satisfy $\rho_1 > \rho_2$.

Also, the number of pores in the glass layer fired at 580° C. tends to be more than that of the glass layer fired at 570° C. However, the cause thereof cannot be resolved. As the possibility thereof, the following two are considered.

(1) In the glass layer fired at 580° C., pores expand more due to a higher temperature to become easy to count.

(2) The decomposition of organic residues adhered to the glass powder proceeds more at 580° C. to increase the number of pores.

Next, the presence or absence of the occurrence of precipitated crystals was examined. When precipitated on the surface of the glass scattering layer, the crystals can be easily visually recognized under an optical microscope, because when no crystals are precipitated, the surface of the glass layer is very smooth, and a peculiar point is conspicuous. The difference between the crystals and foreign matter can be easily judged from the symmetry of the shape and the like. Further, the precipitated crystals in the inside of the scattering glass layer can also be easily distinguished from the pores and foreign matter by the shape thereof. The results are shown in Table 5. By selecting proper firing conditions such as firing at 570° C., it is possible to precipitate the crystals only in the inside of the glass layer and to inhibit the occurrence thereof on the surface.

TABLE 5

| Firing Temperature | Inside of Glass Scattering Layer | Surface of Glass Scattering Layer |
|---|---|---|
| 570° C. | Observed | Not observed |
| 580° C. | Observed | observed |

In addition, since the pores and the crystals are generated by different mechanisms, it is possible to generate only the pores or only the crystals by controlling the glass material, the powder particle size, the surface state, the firing conditions (atmosphere, pressure) or the like. For example, crystal precipitation is inhibited by increasing a network former in the glass or increasing an alkali oxide component for inhibiting crystal precipitation, and pore generation is inhibited by firing under reduced pressure.

Then, the particle size distribution of pores in the glass layer prepared this time was measured. When the thickness of the glass layer is 15 μm, all pores in the glass layer can be distinguished under a microscope. The pores in a field of view of 90.5 μm×68.1 μm were distinguished and counted by image processing. The results of measurement at three arbitrary places in the glass layer are shown in Table 6.

TABLE 6

| Observation Site | Number of Pores | Average Pore Particle Size (μm) | Number of Pores per 1 mm² |
|---|---|---|---|
| #1 | 598 | 1.3 | $1.07 \times 10^5$ |
| #2 | 934 | 1.33 | $1.51 \times 10^5$ |
| #3 | 1371 | 1.4 | $2.22 \times 10^5$ |

Further, regarding pore diameter distribution, many pores had a pore diameter of 2 μm or less in case, and the average diameter was from 1.3 to 1.4 μm. Furthermore, the number of pores per 1 mm² of the glass layer was from $1.1 \times 10^5$ to $2.2 \times 10^5$. When a proportional calculation is carried out on the cases where the thickness of the glass layer was 30 μm and 60 μm, using the above-mentioned measurement results (the thickness of the glass layer was 15 μm), the number of pores in the case where the thickness of the glass layer was 30 μm was from $2.2 \times 10^5$ to $4.4 \times 10^5$, and the number of pores in the case where the thickness of the glass layer was 60 μm was from $4.4 \times 10^5$ to $8.8 \times 10^5$.

When the light-extraction efficiency was measured, it was seen that if about 200,000 of the above pores were present per mm², the light-extraction efficiency was improved by 15%, compared to the case where the scattering material was not added.

Example 2

Measurement of Wiring Resistance 87.2 g of Ag powder having an average particle size of 1 μm, 2.7 g of a glass frit of Bi—Zn—B system, and 10 g of an organic vehicle (a solution in which 10 wt % of ethyl cellulose is dissolved in α-terpineol) were kneaded to prepare an Ag paste.

Figure 17:
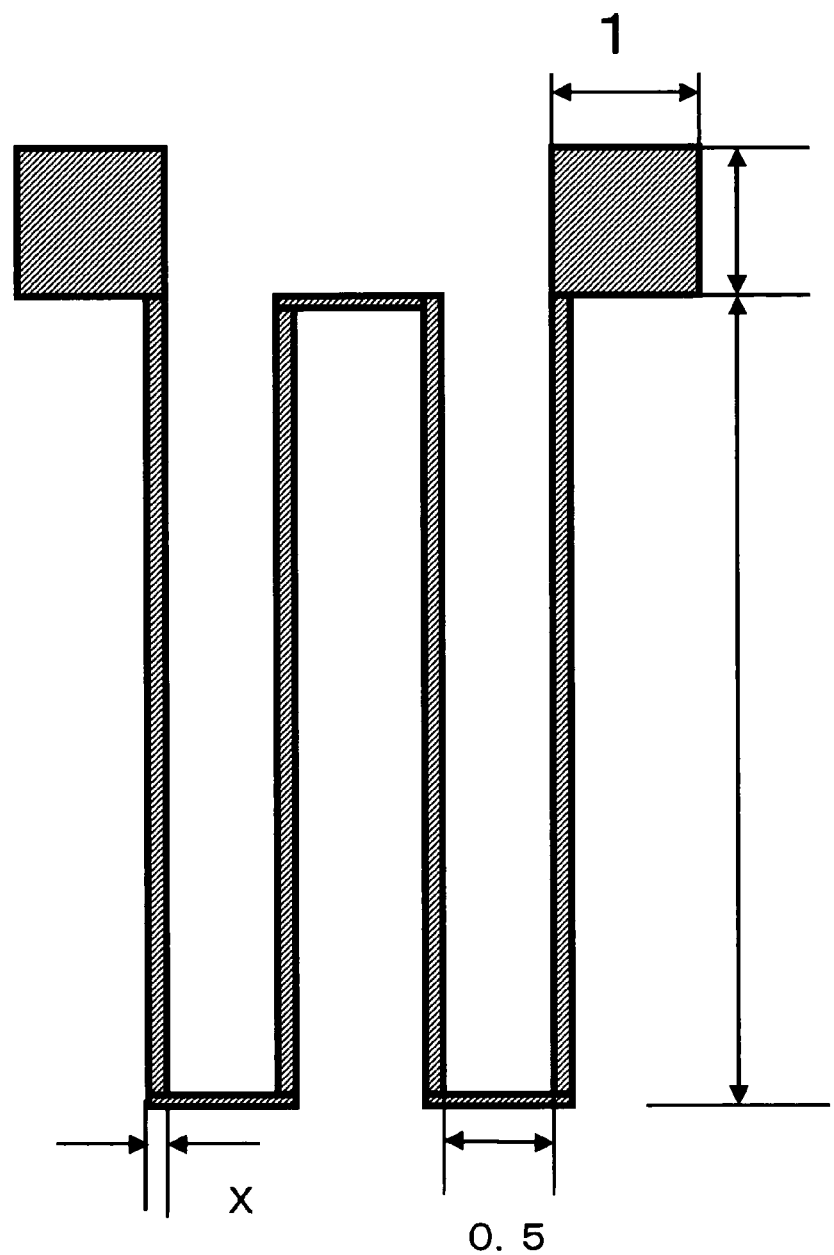
FIG. 17 is a view showing a wiring pattern used for measuring the wiring resistance in Example 2 of the invention.

On a soda lime glass substrate having a surface coated with a silica film and a size of 5 cm square and a thickness of 0.55 mm, the wiring pattern shown in FIG. 17 was formed by the screen printing method. Herein, X represents a line width, and a mask size was set to 100 μm, 200 μm, and 500 μm. Also, the unit of the numbers in the drawing is mm.

After the thus obtained substrate was dried at 150° C. for 30 minutes, and the temperature thereof returned to room temperature temporarily, the temperature was raised to 450° C. in 30 minutes and kept at 450° C. for 30 minutes, whereby the resin in the organic vehicle was decomposed and removed. Thereafter, the temperature of the resultant was raised to 575° C. in 12 minutes and kept at 575° C. for 30 minutes, thereby sintering the Ag powder. Subsequently, the temperature of the resultant was dropped to room temperature within 3 hours, thereby forming an Ag wiring pattern on the soda lime glass substrate.

Further, 88.5 g of Au powder having an average particle size of 1 μm, 1.5 g of a glass frit of Bi system, and 10 g of an organic vehicle (a solution in which 10 wt % of ethyl cellulose was dissolved in α-terpineol) were kneaded to prepare an Au paste. By using this Au paste, an Au wiring pattern was formed using the same method as the Ag paste.

The resistance of the wiring pattern formed was measured. The measurement was performed by using a tester CD-782C of Sanwa Electric Instrument Co., Ltd in a two-terminal method. The contact resistance of the probe and the wiring was corrected by subtracting a value obtained when the probe was brought close to the wiring from an actual measurement value. The size of the wiring and the measurement result of the resistance are shown in Table 7.

TABLE 7

| Composition | Ag | | | Au | | |
|---|---|---|---|---|---|---|
| Firing temperature (° C.) | 575 | | | 575 | | |
| Wiring width (μm) | 200 | 300 | 570 | 150 | 240 | 520 |
| Film thickness (μm) | 9.0 | 13.5 | 15.5 | 5.0 | 7.5 | 8.5 |
| Resistance value (Ω) | 3.5 | 1.5 | 0.8 | 11.2 | 4.8 | 1.7 |
| Sheet resistance (mΩ/square) | 4.3 | 2.8 | 2.8 | 10.4 | 7.1 | 5.5 |

Example 3

Contact Resistant Measurement of Wiring and ITO

Figure 18:
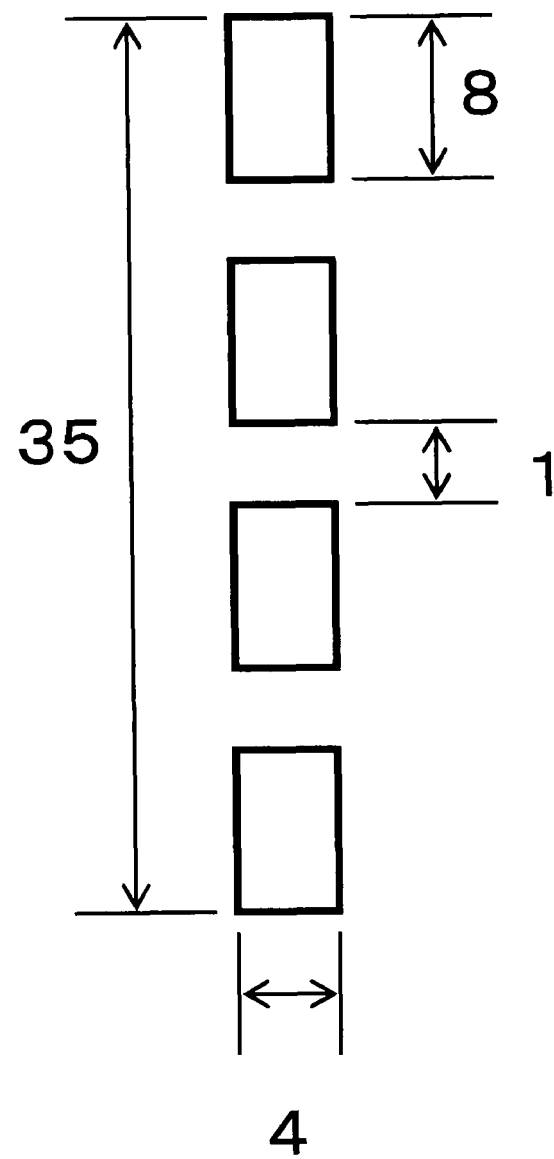
FIG. 18 is a view showing a pad used for measuring the contact resistance between the wiring and ITO in Example 3 of the invention.

Next, a TEG (Test Element Group) for evaluating the contact resistance characteristics of the translucent electrode and the auxiliary wiring was prepared. By using the Ag paste and the Au paste obtained in the above method, a pad shown in FIG. 18 was formed. Herein, the unit of the numbers in the drawing is mm. The film thicknesses of the Ag and Au pastes were 11.5 μm and 5.0 μm respectively. Subsequently, in the following procedure, the glass layer was formed. In order to make the composition represented by the mol % shown in Table 8, each powder raw material of $P_2O_5$, $B_2O_3$, $Li_2O$, $Bi_2O_3$, $Nb_2O_5$, $WO_3$, and ZnO, was weighed to yield 200 g in total, followed by mixing. Thereafter, the mixed powder raw material was melted at 1050° C. for one hour by using a platinum crucible, and melted at 950° C. for a further one hour, thereby obtaining a melt. Half of the melt was poured into a carbon mold to obtain a glass in a bulk shape. Next, the remaining melt was poured into the space between two rolls, followed by rapid cooling, thereby obtaining a glass in a flake shape. The glass in the flake shape was put into an electric furnace at 500° C., and the temperature thereof was decreased to room temperature at a rate of 100° C. hour, thereby removing strain. The prepared flake was dry-milled for one hour with a ball mill made of alumina, thereby obtaining glass powder. The mass average particle size of the obtained glass powder was 3 μm in any case.

The refractive index ($n_d$), the glass transition temperature ($T_g$), the average linear expansion coefficient at 50° C. to 300° C. ($\alpha_{50\text{-}300}$), and the glass softening point ($T_s$) of the obtained glass were measured in the following manner. The results are shown in Table 8.

TABLE 8

| | Mol % |
|---|---|
| $P_2O_5$ | 22.7 |
| $B_2O_3$ | 11.8 |
| $Li_2O$ | 5.0 |
| $Bi_2O_3$ | 14.2 |
| $Nb_2O_5$ | 15.0 |
| $WO_3$ | 8.9 |
| ZnO | 20.6 |
| Refractive index $n_d$ | 1.98 |
| Glass transition temperature $T_g$ (° C.) | 475 |
| Average linear expansion coefficient $\alpha_{50\text{-}300}$ ($\times 10^{-6}$/° C.) | 72 |
| Glass softening point Ts (° C.) | 525 |

1. Refractive Index ($n_d$)

After the glass was polished, the refractive index was measured at a measurement wavelength of 587.6 nm and 25° C. in a V-block method, by using a precision refractometer KPR-2000 manufactured by Kalnew Optical Industrial Co., Ltd.

2. Glass Transition Temperature ($T_g$)

After the glass was processed into a round bar shape with a diameter of 5 mm and a length of 200 mm, the glass transition temperature was measured using a thermal dilatometer TD 5000SA manufactured by Bruker AXS at a rate of temperature increase of 5° C./min.

3. Average Expansion Coefficient ($\alpha_{50\text{-}300}$ at 50° C. to 300° C.

After the glass was processed into a round bar shape with a diameter of 5 mm and a length of 200 mm, the glass transition temperature was measured using a thermal dilatometer TD 5000SA manufactured by Bruker AXS at a rate of temperature increase of 5° C./min.

Provided that the length of the glass bar at 50° C. was denoted as $L_{50}$ and the length of the glass bar at 300° C. was denoted as $L_{300}$, the average linear expansion coefficient ($\alpha_{50\text{-}300}$) at 50° C. to 300° C. was measured by a formula $\alpha_{50\text{-}300} = \{(L_{300}/L_{50})-1\}/(300-50)$.

4. Glass Softening Point ($T_s$)

After the glass was pulverized by using an agate mortar, the glass powder having a particle size of from 74 μm to 106 μm was sieved. 120 mg of the sieved resultant was put into a platinum pan and measured by using a thermal TG/DTA EXSTAR 6000 manufactured by SII NanoTechnology Inc at a rate of temperature increase of 10° C./min, whereby a temperature in the inflection point of the DTA curve accompanied by softening and flowing of the glass observed at the side of a temperature higher than the glass transition temperature ($T_g$) was taken as the glass softening point ($T_s$).

Figure 19:
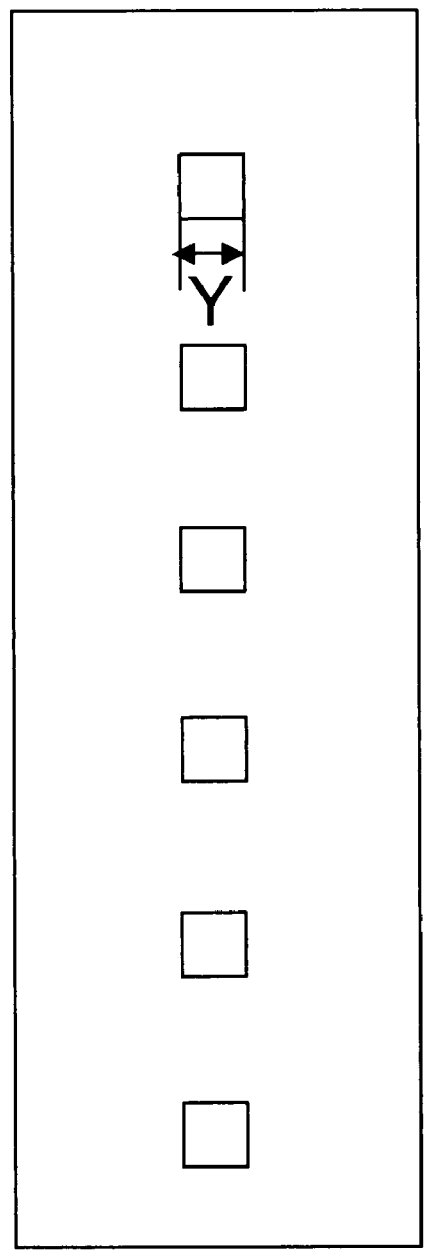
FIG. 19 is a view showing a glass layer pattern having openings used for measuring the contact resistance between the wiring and ITO in Example 3 of the invention.
Figure 20:
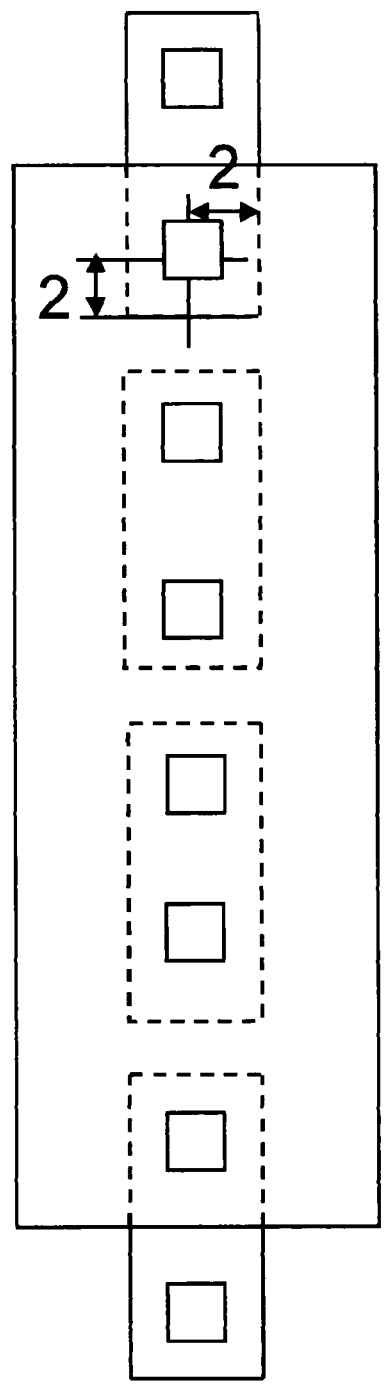
FIG. 20 is a view showing a state where a wiring pattern and the glass layer pattern used for measuring the contact resistance between the wiring and ITO in Example 3 of the invention are laminated with each other.
Figure 21:
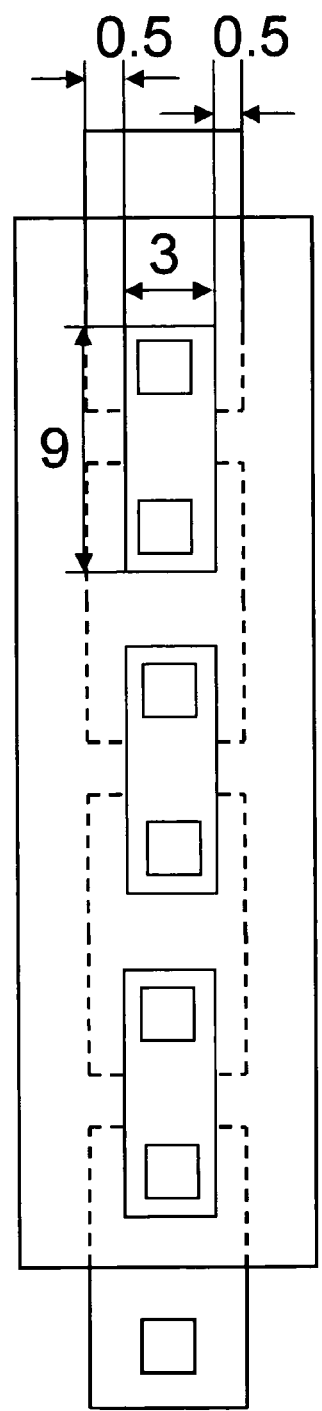
FIG. 21 is a view showing the ITO used for measuring the contact resistance between the wiring and ITO in Example 3 of the invention.

Thereafter, 75 g of a glass frit and 25 g of an organic vehicle (obtained by dissolving 10% by mass of ethyl cellulose in α-terpionel) were kneaded to prepare a glass paste. By using this glass paste, a glass layer pattern having openings shown in FIG. 19 was formed on the wiring pattern shown in FIG. 18 through a screen printing method. Herein, Y represents the length of one side of the opening which is a square. FIG. 20 shows a state where the wiring pattern and the glass layer pattern are laminated to each other. In addition, the unit of the numbers in the drawing is mm. Herein, the film thickness of the glass layer formed on the Ag wiring pattern was 20 μm, and the film thickness of the glass layer formed on the Au wiring pattern was 17 μm. Thereafter, the ITO was formed as shown in FIG. 21 by using a mask sputtering method. Herein, the unit of the numbers in drawing is mm. The sputtering was performed at room temperature. Ar was 99.5 SCCM, $O_2$ was 0.5 SCCM, the pressure was 0.47 Pa, the input electric power was 2.35 W/$cm^2$, and the film thickness was 150 nm. Next, in order to improve the transmittance of the ITO and reduce the resistance, annealing was performed at 200° C. for one hour in the atmosphere. The sheet resistance of the annealed ITO was 33 Ω/square. In this manner, a TEG in which 6 ITOs and a wiring metal contact each other through the openings of the glass layer was formed. The resistance at both ends of the contact TEG was measured, whereby the contact resistance was calculated by subtracting the resistance of the ITO from the measurement value. The resistance of the ITO was calculated by using the sheet resistance (33 Ω/square), the distance between contacts, and the ITO pattern width 3 mm. Since the contact hole diameter is smaller than the ITO width (3 mm), the resistance of the ITO was expected to be larger than the above-described value, and the smaller the contact diameter, the larger the error thereof. Accordingly, when the contact diameter was small, the actual contact resistance was expected to be smaller than the calculated value. The results are shown in Table. 9.

TABLE 9

| Wiring material | Ag | | | Au | | |
|---|---|---|---|---|---|---|
| Firing temperature (° C.) | 575 | | | 575 | | |
| Y (mask size μm) | 200 | 500 | 1000 | 200 | 500 | 1000 |
| Y (actual measurement value μm) | 180 | 475 | 800 | 150 | 500 | 850 |
| TEG resistance value (Ω) | 426 | 240 | 217 | 212 | 152 | 136 |
| Contact resistance (Ω/square) | 62 | 32 | 29 | 27 | 17 | 15 |

As shown in the table, it is seen that in any cases of Ag and Au, as the contact diameter enlarges, the contact resistance decreases; however, in the case of 500 μm and the 1000 μm, the values are almost equivalent.

Example 4

Resistance Measurement of Grid-Like Auxiliary Wiring-Attached ITO

Figure 22:
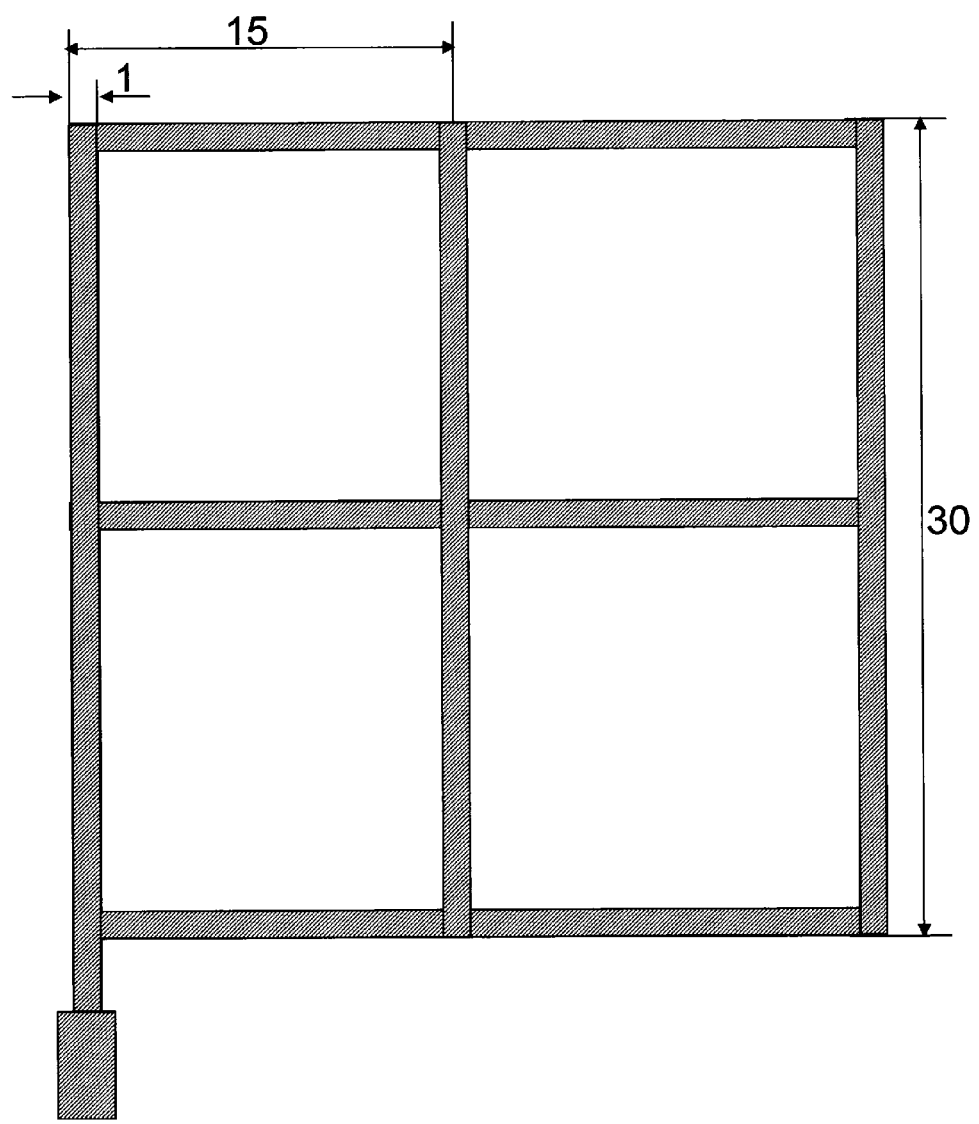
FIG. 22 is a view showing a grid-like wiring pattern used for measuring the resistance of the grid-like auxiliary wiring pattern-attached ITO in Example 4 of the invention.
Figure 23:
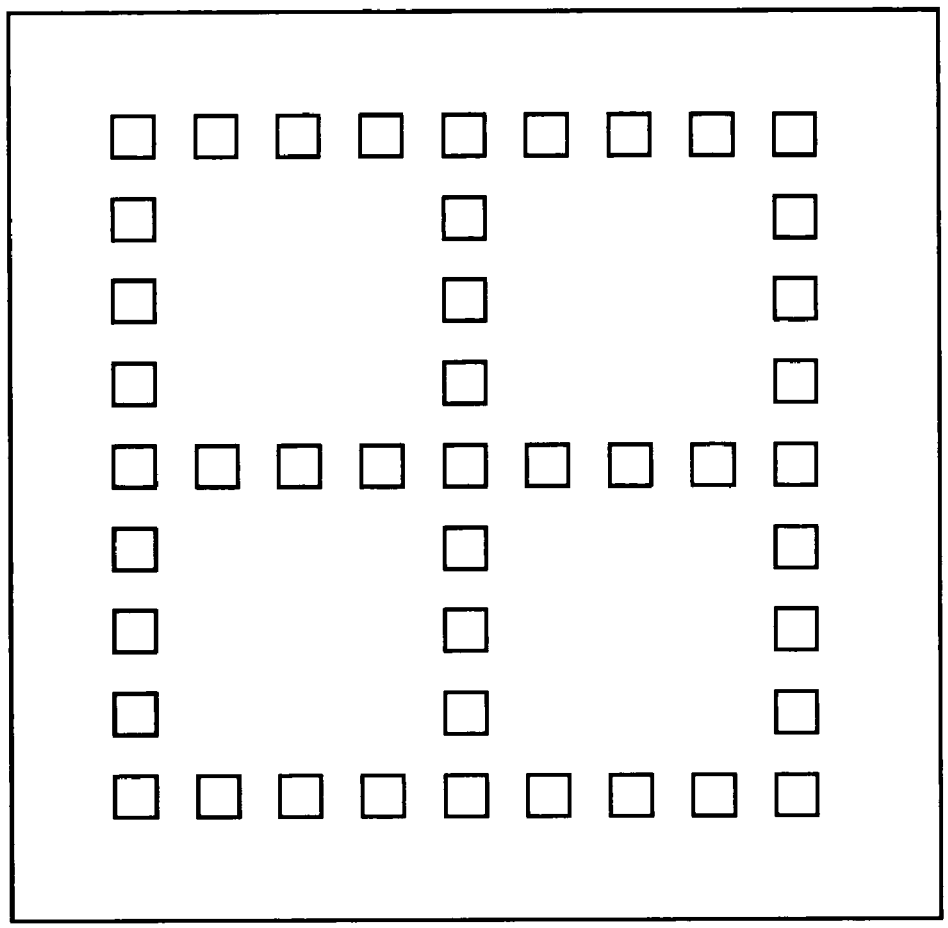
FIG. 23 is a view showing a glass layer having openings used for measuring the resistance of the grid-like auxiliary wiring pattern-attached ITO in Example 4 of the invention.
Figure 24:
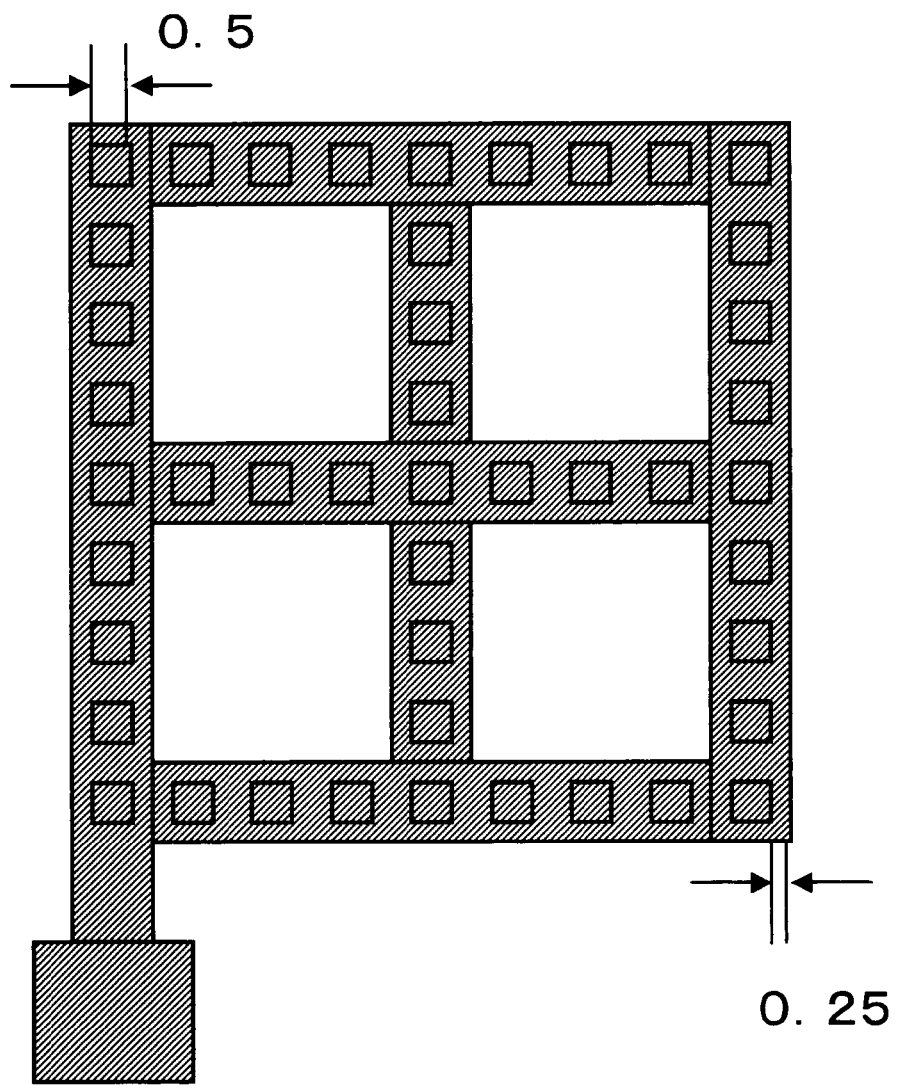
FIG. 24 is a view showing the positional relationship between the wiring and the openings used for measuring the resistance of the grid-like auxiliary wiring pattern-attached ITO in Example 4 of the invention.
Figure 25:
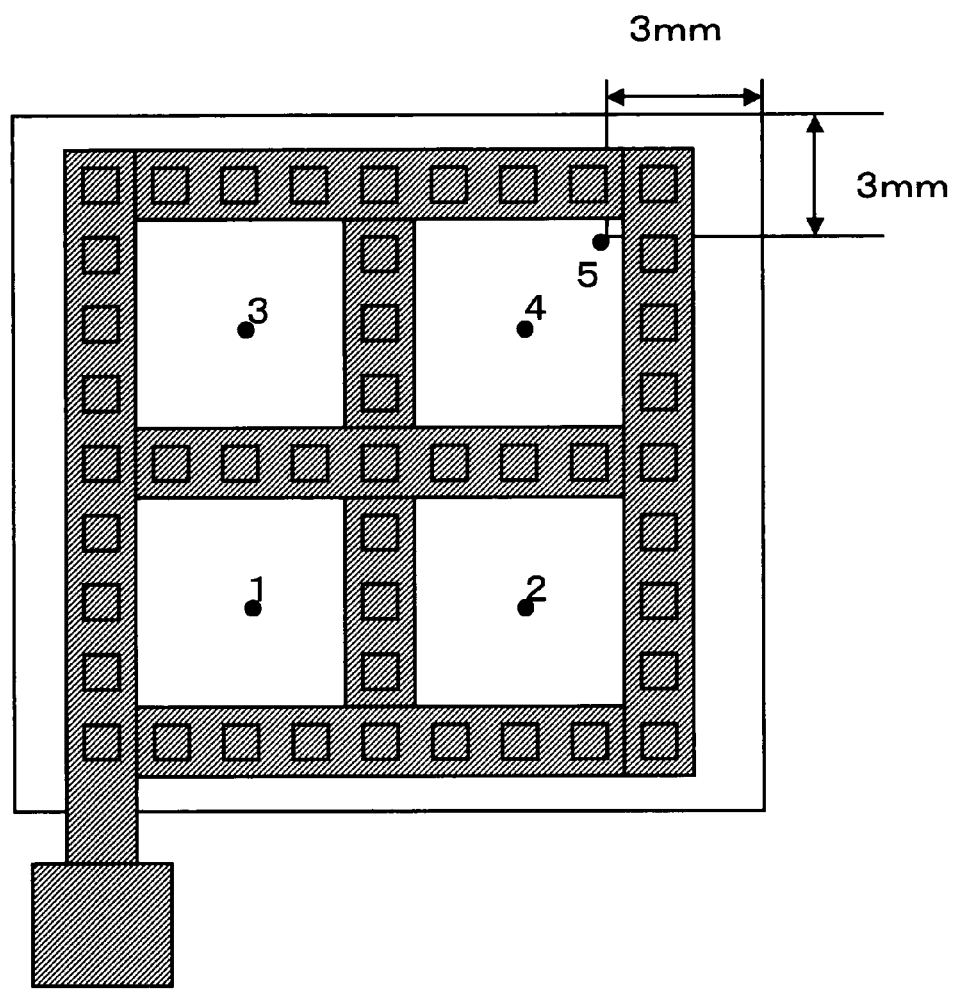
FIG. 25 is a view showing an auxiliary wiring pattern used for measuring the resistance of the grid-like auxiliary wiring pattern-attached ITO in Example 4 of the invention.

Next, a test pattern to which the ITO would be connected through the openings of the glass layer was formed on the auxiliary wiring pattern having a grid shape, whereby whether the resistance of the ITO had been reduced by the electrical connection to the auxiliary wiring was examined. By using the above-described glass substrate, the Ag paste and the Au paste, the wiring pattern having a grid shape shown in FIG. 22 was formed. Herein, the film thickness of the Ag wiring pattern was 13.5 μm, and the film thickness of the Au wiring pattern was 7 μm. Also, the unit of the numbers in the drawing is mm. Subsequently, by using the above-described glass paste, a glass layer having openings of 500 μm squares was formed on the grid-like wiring pattern shown in FIG. 23. Herein, the film thickness of the glass layer formed on the Ag wiring pattern was 20 μm, and the film thickness of the glass layer formed on the Au wiring pattern was 15 μm. The total light transmittance and the Haze value of the glass layer-attached substrate prepared in this manner were 85.0 and 71.0 respectively. The measurement was carried out by using a Haze computer (trade name: HZ-2) manufactured by Suga Test Instruments Co., Ltd as a measurement device and using an untreated plate of the glass substrate PD200 as a reference. FIG. 24 shows the positional relationship between the wiring and the openings. Also, the unit of the numbers in the drawing is mm. Next, the ITO was mask-sputtered. The pattern of the formed ITO is a square in which the length of one side is 31 mm, and is so formed that it coats the openings of the glass layer. Thereafter, the same heat treatment as above was performed to reduce the resistance of the ITO and to improve the transmittance. In this manner, an ITO electrically assisted by the grid-like Ag and Au wirings was formed. In order to examine the degree of reduction of the resistance of the ITO, a cerasolzer manufactured by Senju Metal Industry Co., Ltd was heated and attached to the ITO in positions from a point 1 to a point 5 in FIG. 25 by using a soldering iron. Thereafter, the contact resistance thereof to the tester was reduced, and then the resistance between each point and a lower left terminal portion was measured.

Figure 26:
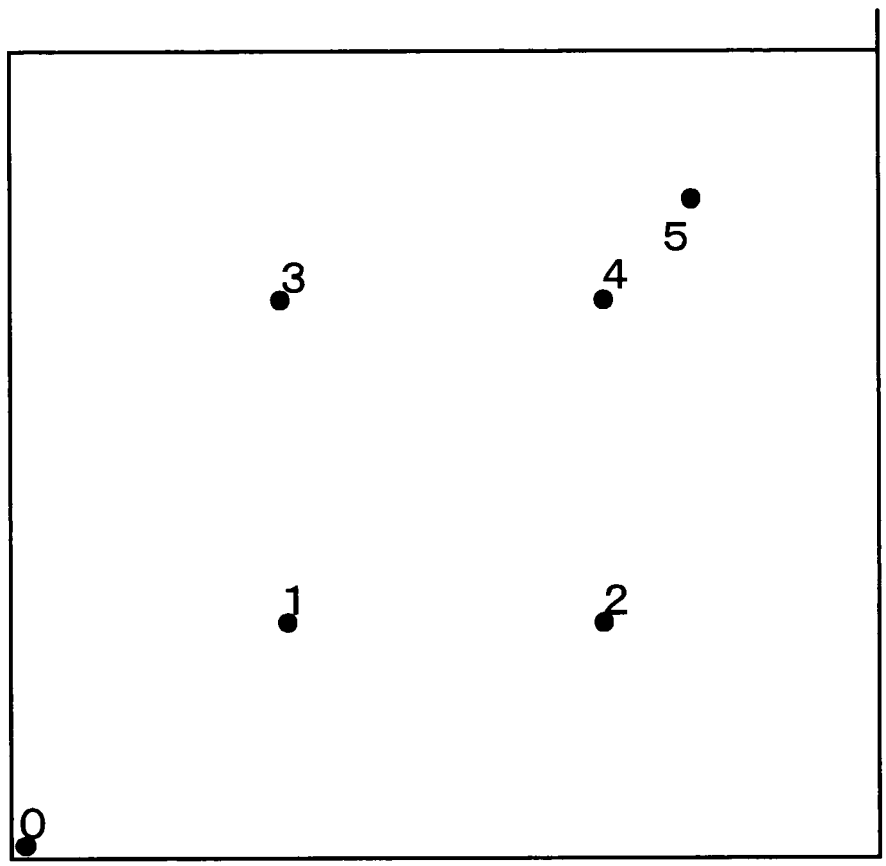
FIG. 26 is a view showing measurement points used for measuring the resistance of the grid-like auxiliary wiring pattern-attached ITO in Example 4 of the invention.

Furthermore, the unit of the numbers in the drawing is mm. Herein, point 1 to point 4 were placed in the center of each grid. As a reference, a cerasolzer was attached to the ITO pattern which had undergone the annealing treatment and was 31 mm on each side, in the manner shown in FIG. 26, whereby each resistance between the points 0 and the points from 1 to 5 was measured. The results thereof are shown in Table 10.

TABLE 10

| Resistance between terminals (Ω) | Ag | Au | None (reference) |
|---|---|---|---|
| No. 1 | 10.6 | 9.3 | 28.1 |
| No. 2 | 10.0 | 9.2 | 41.5 |
| No. 3 | 10.2 | 9.0 | 40.2 |
| No. 4 | 10.2 | 10.5 | 43.3 |
| No. 5 | 10.3 | 7.4 | 53.8 |
| Place dependence of the resistance value between terminals | ○ | ○ | x |

As shown in the table, in the case of the reference not having the auxiliary wiring, the resistance value increases as the distance from the point 0 increases, and thus is not preferable. On the other hand, when the Ag or Au auxiliary wiring is provided, the resistance value is almost constant even though the distance from the point 0 increases; also, compared to the reference, the resistance is reduced. The auxiliary wiring of an Al system or Ag system formed by usual sputtering exhibits a sheet resistance of 50 mΩ/square to 100 mΩ/square, hence this shows that the auxiliary wiring having a resistance as low as one tenth of the usual wiring has been realized herein. Since the steps differences of the wiring are flattened by the glass layer formed thereon, a problem such as disconnection of the ITO occurring on the wiring portion is not observed. In the result of Example 3, the contact resistance of the mask size of 500 μm square is 32Ω for the Ag wiring, and is 17Ω for the Au wiring. In this example, since 16 openings of the 500 μm square are arranged per auxiliary wiring grid, the contact resistance to the auxiliary wiring is 2.0Ω for the Ag and is 1.1Ω for the Au, which is sufficiently reduced compared to the sheet resistance of the ITO.

In addition, when the organic EL element is prepared on the prepared substrate, if the element is formed on the openings of the glass layer, the surface of the auxiliary wiring of the openings is roughened, so there is a possibility of a short circuit of the element occurring. In this case, for example, by forming a film of cathode on the openings or by using a method of filling a resin to smooth and insulate the openings, a short circuit of the element in the openings can be prevented.

Figure 27:
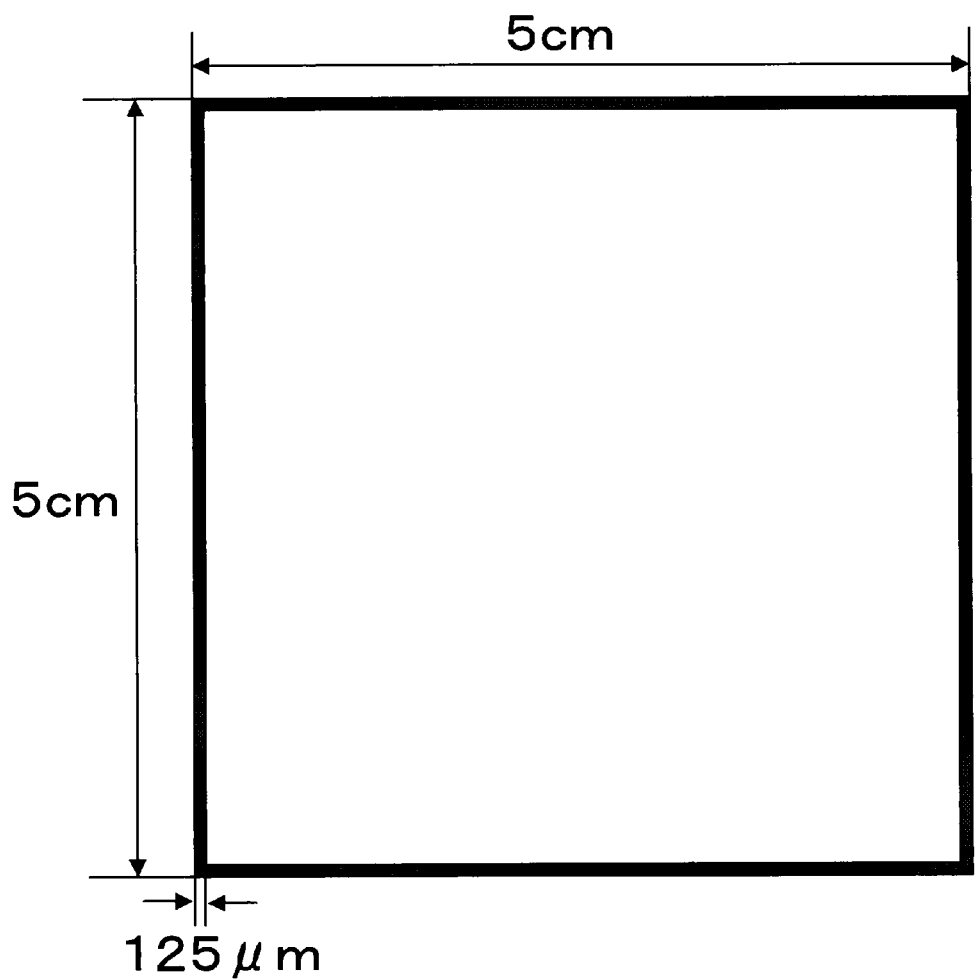
FIG. 27 is a view showing a wiring example of the auxiliary wiring pattern in measuring the resistance of the grid-like auxiliary wiring pattern-attached ITO in Example 4 of the invention.
Figure 28:
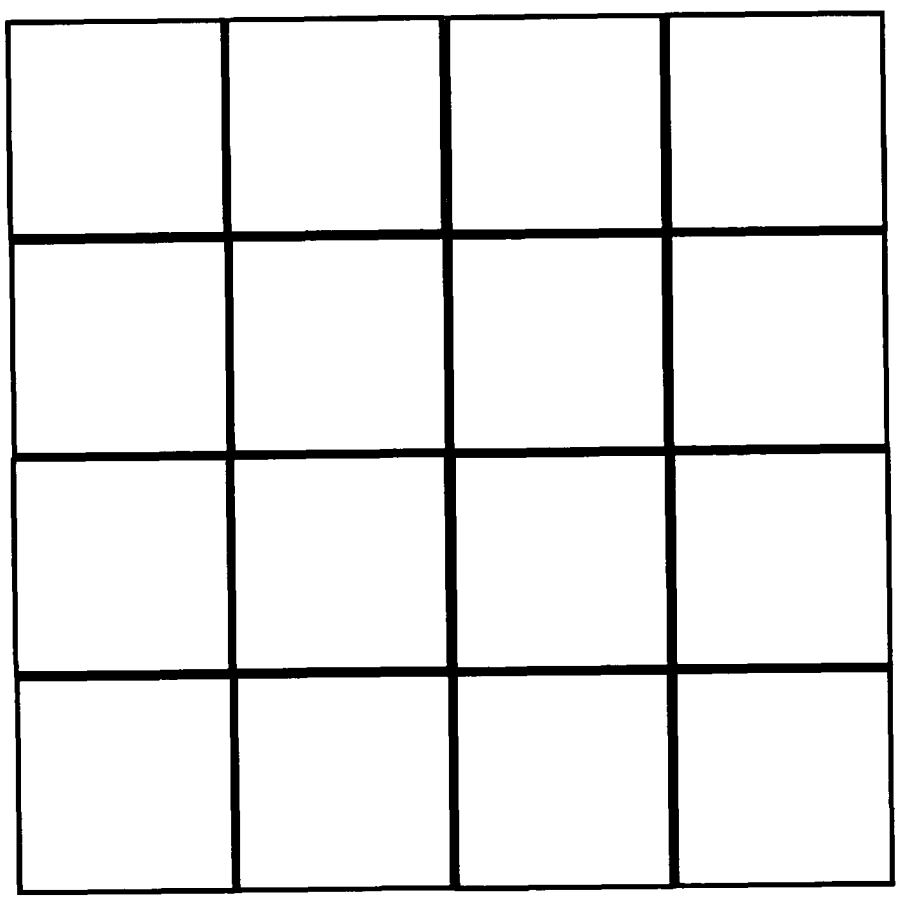
FIG. 28 is a view showing a modification example of the wiring example of the auxiliary wiring pattern in measuring the resistance of the grid-like auxiliary wiring pattern-attached ITO in Example 4 of the invention.
Figure 29:
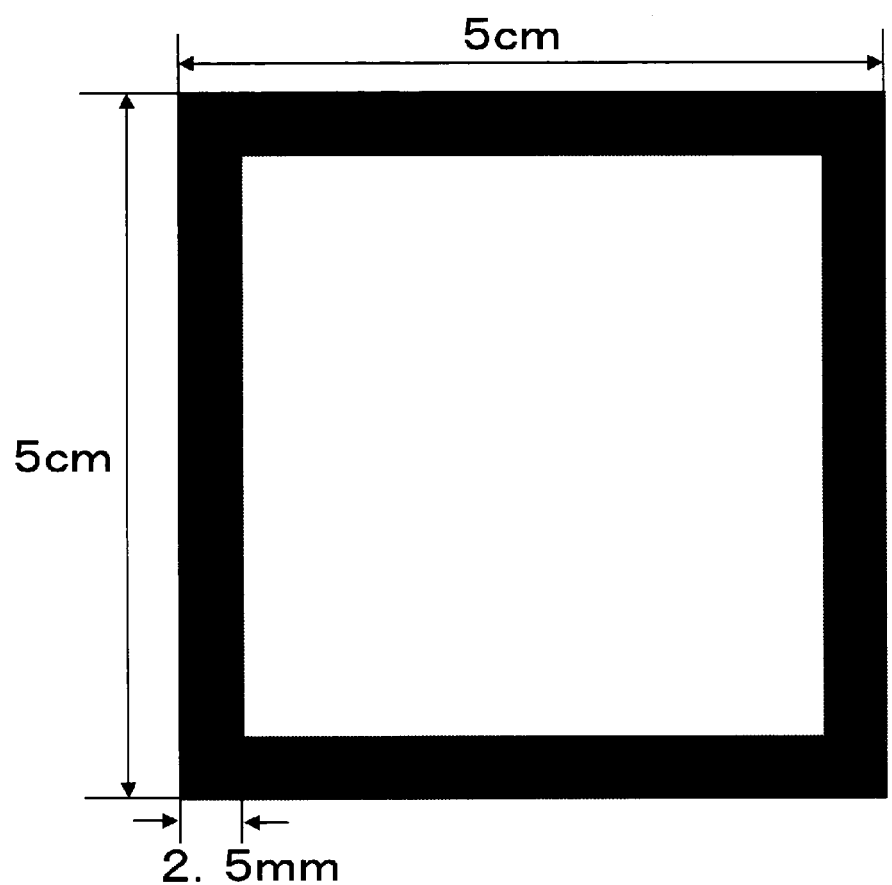
FIG. 29 is a view showing a modification example of the wiring example of the auxiliary wiring pattern in measuring the resistance of the grid-like auxiliary wiring pattern-attached ITO in Example 4 of the invention.
Figure 30:
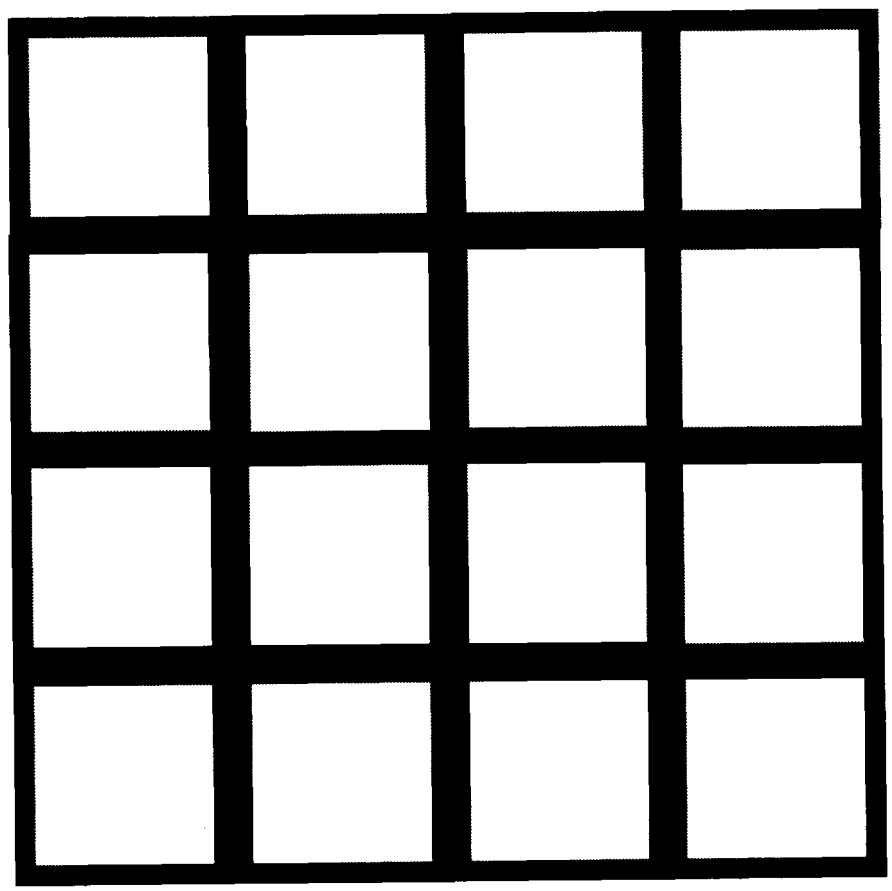
FIG. 30 is a view showing a modification example of the wiring example of the auxiliary wiring pattern in measuring the resistance of the grid-like auxiliary wiring pattern-attached ITO in Example 4 of the invention.

The invention is effective to increase the area of an OLED element, as described below. Herein, for example, a case of assisting an ITO having the sheet resistance of 10 Ω/square is considered. The size of a square that can uniformly emit light by using the ITO having such a sheet resistance is thought to be about 5 cm square. If an auxiliary wiring with a width of 125 μm is provided to the ITO of the 5 cm square along the edge of the ITO, as shown in FIG. 27 (the glass layer and the openings thereof are omitted), the ratio of the opening is reduced by about 1%. Provided that the sheet resistance of the auxiliary wiring is 3 mΩ/square, the resistance of one side of the auxiliary wiring becomes 3 mΩ/square×400 squares= 1.2Ω. If the auxiliary wiring is arranged into the grid shape as shown in FIG. 28, the sheet resistance seemingly becomes 0.6 Ω/square. If the uniform light emission of 5 cm is obtained with the resistance of 10 Ω/square, it is assumed that the uniform light emission of 83 cm (5 cm×10/0.6 is equal to about 83 cm) at each side can be obtained by using the auxiliary wiring. Although the proportion of the openings lost is 1%, the light extraction is drastically improved if a glass scattering layer with a high refractive index is used as the glass layer. Therefore, the loss is not problematic. Also, this type of auxiliary wiring is not an issue in terms of appearance, or, if a scattering film is adhered to the outer surface of the panel, the auxiliary wiring is not visually recognized. Moreover, if the line width of the auxiliary wiring further increases, it is possible to further increase the size. Meanwhile, in a sputtered aluminum film or the like used as a conventional method, the sheet resistance is about 0.1 Ω/square. When such an auxiliary wiring having a width of 125 μm is provided on the ITO of 5 cm square, the resistance is 0.1 Ω/square×400 squares=40Ω, so it does not functions as an auxiliary wiring. The line width necessary for making the sheet resistance to be 1Ω at the time when the auxiliary wiring is arranged on the grid to function as an auxiliary wiring becomes 2.5 mm (FIG. 29), and the rate of openings increases about 20% (FIG. 30). In this case, not only the efficiency in using light decreases, but also the appearance of the grid shape becomes a problem in some cases. In the manner described above, by using the glass scattering layer having a high refractive index and the thick auxiliary wiring contacting the translucent electrode through the openings of the scattering layer embedded under the glass scattering layer, it is possible to realize the organic LED element having a large area and high light-extraction efficiency, which could not be realized in the conventional technique.

In this embodiment, the organic LED element has been described. However, in the case of the organic LED element, both a top emission structure and a back emission structure are effective. Also, the invention is not limited to the above structure, and is effectively applied to an electronic device such as DRAM as well as the inorganic LED element and an optical device such as a solar cell.

While the invention has been described in detail and with reference to specific embodiments thereof, it will be understood by those skilled in the art that various changes and modifications may be made therein without departing from the spirit and scope of the invention.

The present application is based on Japanese Patent Application No. 2008-259948 filed on Oct. 6, 2008, the contents of which are incorporated herein by reference.

INDUSTRIAL APPLICABILITY

As has been described above, since the substrate for an electronic device has an auxiliary wiring coated with a glass layer and a smooth surface, it is possible to provide an electronic device having a long life and a high reliability. Furthermore, since the substrate has waviness, it is possible to inhibit the translucent electrode from being visually recognized.

Moreover, by using the scattering glass layer which is stable and is excellent in light scatterability and high in reliability, it is possible to increase light-extraction efficiency or incorporation efficiency, hence the invention can be applied to electronic devices in general including light-emitting devices, light-receiving devices and the like.

The invention claimed is:

1. A substrate for an electronic device in which an electrode wiring is formed on a first main surface side of a glass substrate, the substrate comprising:
    an auxiliary wiring pattern formed on the first main surface of the glass substrate in a grid-like pattern arranged horizontally and vertically; and
    a translucent glass layer formed on a surface of the glass substrate to cover the first main surface and the auxiliary wiring pattern,
    wherein, in a portion of the translucent glass layer formed on the auxiliary wiring pattern, through-holes exposing the auxiliary wiring pattern are formed in each side of each grid of the grid-like pattern at uniform intervals.

2. The substrate for an electronic device according to claim 1, wherein a surface roughness Ra of a surface of the translucent glass layer is 30 nm or less.

3. The substrate for an electronic device according to claim 1, wherein the auxiliary wiring pattern formed on the first main surface of the glass substrate is formed of a conductor layer with a line width of 0.05 to 2 mm and a film thickness of 0.5 to 30 um.

4. The substrate for an electronic device according to claim 1, wherein the auxiliary wiring pattern comprises a silver conductor.

5. A process for producing a substrate of claim 1.

6. An electronic device comprising:
    a substrate for an electronic device, comprising:
        a glass substrate;
        an auxiliary wiring pattern formed on a first main surface of the glass substrate in a grid-like pattern arranged horizontally and vertically; and
        a translucent glass layer formed to cover the first main surface as well as the auxiliary wiring pattern except for a portion comprising through-holes, the through-holes formed in each side of each grid of the grid-like pattern at uniform intervals; and
    a functional element formed on the translucent glass layer, wherein the functional element is conductively connected to the auxiliary wiring pattern through the through-holes formed in a portion of the translucent glass layer.

* * * * *